(12) United States Patent
Yoon et al.

(10) Patent No.: US 9,535,272 B2
(45) Date of Patent: Jan. 3, 2017

(54) APPARATUS AND METHOD FOR MANUFACTURING DISPLAY DEVICE

(75) Inventors: YongJoong Yoon, Paju-si (KR); SooYoung Park, Paju-si (KR); InJue Kim, Paju-si (KR); YoungKyu Bang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 543 days.

(21) Appl. No.: 13/335,322

(22) Filed: Dec. 22, 2011

(65) Prior Publication Data

US 2012/0264345 A1  Oct. 18, 2012

(30) Foreign Application Priority Data

Apr. 14, 2011  (KR) .................. 10-2011-0034589

(51) Int. Cl.
| | | |
|---|---|---|
| *H01L 23/10* | (2006.01) | |
| *G02F 1/13* | (2006.01) | |
| *G02F 1/1339* | (2006.01) | |
| *H01L 51/52* | (2006.01) | |
| *H01L 51/56* | (2006.01) | |
| *H01L 21/56* | (2006.01) | |
| *G02F 1/1333* | (2006.01) | |

(52) U.S. Cl.
CPC ........... *G02F 1/1303* (2013.01); *G02F 1/1339* (2013.01); *G02F 2001/133311* (2013.01); *H01L 21/56* (2013.01); *H01L 51/5246* (2013.01); *H01L 51/56* (2013.01); *H01L 2924/0002* (2013.01)

(58) Field of Classification Search
CPC .... H01L 51/56; H01L 51/5246; G02F 1/1303; G02F 1/1339
USPC .......................................................... 445/25
See application file for complete search history.

(56) References Cited

U.S. PATENT DOCUMENTS

| | | | | |
|---|---|---|---|---|
| 5,292,368 | A | * | 3/1994 | Komine et al. ............... 118/315 |
| 5,437,727 | A | * | 8/1995 | Yoneda et al. ............... 118/669 |
| 2005/0112283 | A1 | * | 5/2005 | Chae et al. .................... 427/258 |
| 2006/0281384 | A1 | * | 12/2006 | Unno ..................... H01J 9/261 |
| | | | | 445/25 |
| 2008/0002140 | A1 | * | 1/2008 | Motomatsu .................. 349/187 |

(Continued)

FOREIGN PATENT DOCUMENTS

| | | |
|---|---|---|
| CN | 101439330 A | 5/2009 |
| CN | 101549338 A | 10/2009 |

(Continued)

OTHER PUBLICATIONS

Office Action issued in corresponding Taiwanese Patent Application No. 100149275, mailed May 26, 2014, 15 pages.

(Continued)

*Primary Examiner* — Nimeshkumar Patel
*Assistant Examiner* — Christopher Raabe
(74) *Attorney, Agent, or Firm* — Brinks Gilson & Lione

(57) ABSTRACT

Disclosed are a display manufacturing apparatus and method, which form a sealing member for protecting an edge portion of a display panel, in a display device where the display panel is exposed to the outside by removing some of cases and set covers. The display manufacturing apparatus includes a base frame, a panel supporting part, and a sealing member. The sealing member forming part is disposed at the base frame, and forms a sealing member at an edge portion of a display panel which is disposed at the panel supporting part.

24 Claims, 20 Drawing Sheets

(56) References Cited

U.S. PATENT DOCUMENTS

| | | | |
|---|---|---|---|
| 2008/0170197 A1* | 7/2008 | Byun et al. | ............ 349/189 |
| 2008/0210894 A1 | 9/2008 | Ahn et al. | |
| 2009/0267507 A1* | 10/2009 | Takashima | ....... H01L 51/0011 |
| | | | 313/511 |
| 2010/0267307 A1 | 10/2010 | Park et al. | |
| 2011/0218267 A1 | 9/2011 | Shinano et al. | |

FOREIGN PATENT DOCUMENTS

| | | | |
|---|---|---|---|
| CN | 101813857 A | | 8/2010 |
| JP | 2003093945 A | | 4/2003 |
| JP | 2007121683 A | | 5/2007 |
| KR | 20060086607 | * | 9/2006 |
| TW | 200720753 | | 6/2007 |
| TW | 200932373 A | | 8/2009 |
| TW | 201039301 A | | 11/2010 |
| TW | 201107357 A | | 3/2011 |

OTHER PUBLICATIONS

Office Action issued in corresponding Chinese Patent Application No. 201110449980.X, mailed May 23, 2014, 14 pages.

* cited by examiner

APPARATUS AND METHOD FOR MANUFACTURING DISPLAY DEVICE

Pursuant to 35 U.S.C. §119(a), this application claims the benefit of earlier filing date and right of priority to Korean Application 10-2011-0034589 filed on Apr. 14, 2011, the content of which is incorporated by reference herein in its entirety.

BACKGROUND

Field of the Invention

The present disclosure relates to a display device, and more particularly, to a display manufacturing apparatus and method, which form a sealing member for protecting an edge portion of a display panel, in a display device where the display panel is exposed to the outside by removing some of cases and set covers.

Discussion of the Related Art

Recently, flat panel display devices that can decrease weight and volume compared to Cathode Ray Tubes (CRTs) are being developed. Liquid Crystal Display (LCD) devices, Plasma Display Panels (PDPs), Field Emission Display (FED) devices, and light emitting display devices are actively being researched as flat type display devices. However, among such flat panel display devices, LCD devices are easily manufactured, have good drivability of drivers, realize a high-quality image, and thus are attracting much attention.

In terms of technology and design interesting to consumers, recently, research and development of flat panel display devices are increasingly required. Therefore, efforts are being continuously made for minimizing (slimming) the thicknesses of display devices, and research is increasingly conducted on a design with enhanced sense of beauty that can induce consumers to buy by appealing to the consumers' sense of beauty.

However, in design development for enhancing a scene of beauty or slimming of display devices that have been made to date, elements configuring a related art display device have been applied as is, and the structures of the elements have been changed. Due to these reasons, there are limitations in slimming display devices and developing the new designs of the display devices.

For example, in LCD devices of the related art, a lower case and a front case are necessarily used for receiving a liquid crystal display panel and a backlight unit, and moreover, a separate front set cover and rear set cover are additionally used for applying the LCD devices to notebook computers, monitors, mobile devices, televisions, etc. As described above, display devices of the related art necessarily use the front set cover and rear set cover as well as the lower case and front case, and consequently, there are limitations in reducing the thicknesses of LCD devices or changing the designs thereof. Particularly, the front set cover and rear set cover necessarily cover a top edge of a liquid crystal display panel. Due to this reason, the thicknesses of display devices inevitably become thicker, and moreover, the border widths of the display devices enlarge. In addition, it is difficult to realize various innovative designs due to a step height in a border portion.

BRIEF SUMMARY

A display manufacturing apparatus includes: a base frame; a panel supporting part disposed at the base frame, and supporting a display panel which includes a lower substrate, an upper substrate facing-coupled to the lower substrate, and at least one upper film adhered to the upper substrate; and a sealing member forming part disposed at the base frame, and forming a sealing member at an edge portion of a display panel which is disposed at the panel supporting part.

In another aspect of the present invention, there is provided a display manufacturing method including: preparing a display panel which includes a lower substrate, an upper substrate facing-coupled to the lower substrate, and at least one upper film adhered to the upper substrate; disposing the display panel on the panel supporting part which is disposed at a base frame; and forming a sealing member at an edge part of the display panel which is supported by the panel supporting part.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a display manufacturing apparatus and method according to embodiments of the present invention will be described with reference to the accompanying drawings.

Figure 1:
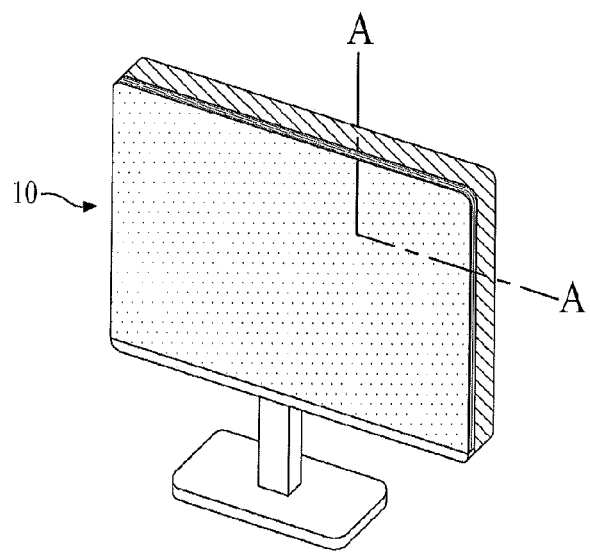
FIG. 1 is a view illustrating a display device according to a first embodiment of the present invention.
Figure 2:
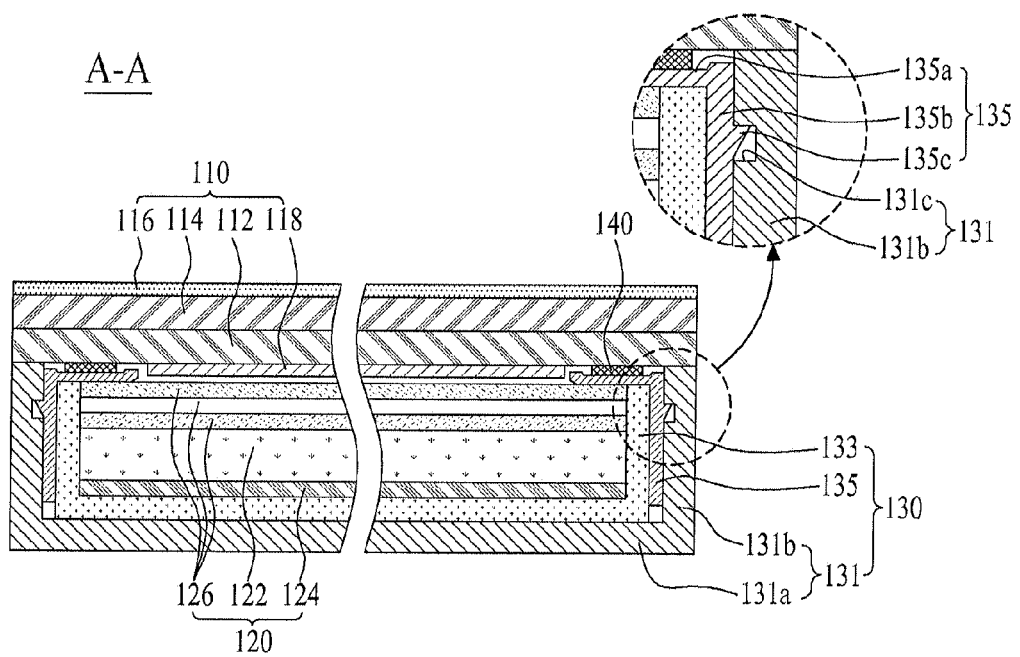
FIG. 2 is a sectional view illustrating a sectional surface taken along line A-A of FIG. 1.

FIG. 1 is a view illustrating a display device according to a first embodiment of the present invention. FIG. 2 is a sectional view illustrating a sectional surface taken along line A-A of FIG. 1.

Referring to FIGS. 1 and 2, a display device 10 according to the first embodiment of the present invention includes a display panel 110 including a facing-coupled lower substrate 112 and upper substrate 114, a backlight unit 120 that irradiates light on the display panel 110, a supporting member 130 that receives the backlight unit 120 and supports the display panel 110 in order for a front surface and side of the display panel 110 to be exposed to the outside, and a panel coupling member 140 that couples the display panel 110 and the panel supporting member 130.

The display panel 110 includes a lower substrate 112, an upper substrate 114 that is facing-coupled to the lower substrate 112 with a liquid crystal layer (not shown) therebetween, an upper polarizing film 116 that is adhered to the upper substrate 114, and a lower polarizing film 118 that is adhered to a rear surface of the lower substrate 112.

The lower substrate 112 includes a plurality of pixels (not shown) formed in respective regions that are defined by intersection of a plurality of gate lines (not shown) and data lines (not shown). Each of the pixels may include a thin film transistor (not shown) that is connected to a gate line and a data line, a pixel electrode that is connected to the thin film transistor, and a common electrode that is formed to be adjacent to the pixel electrode and receives a common voltage. Herein, the common electrode may be formed at the upper substrate 114 according to a driving mode of the liquid crystal layer. The lower substrate 112 generates an electric field corresponding to a difference voltage between a data voltage and the common voltage that are applied to each pixel, and adjusts light transmittance of the liquid crystal layer.

The upper substrate 114 includes a color filter corresponding to each pixel that is formed at the lower substrate 112 and is facing-coupled to the lower substrate 112 with the liquid crystal layer therebetween. Herein, the common electrode receiving the common voltage may be formed at the upper substrate 114 according to the driving mode of the liquid crystal layer. The upper substrate 114 filters light, incident thereon through the liquid crystal layer, to emit certain color light to the outside by using a plurality of color filters, and thus allows a certain color image to be displayed on the display panel 110.

Herein, detailed structures of the lower substrate 112 and upper substrate 114 may be formed variously according to a driving mode of the liquid crystal layer, for example, a Twisted Nematic (TN) mode, a Vertical Alignment (VA) mode, an In-Plane switching (IPS) mode, or a Fringe Field Switching (FFS) mode.

The upper polarizing film 116 is adhered to entire one surface of the upper substrate 114 and polarizes light that is emitted to the outside through the upper substrate 114. The upper polarizing film 116 is formed to have the same size as that of the front surface of the upper substrate 14 and adhered to the entire one surface of the upper substrate 114, by a cutting process. Each side of the upper polarizing film 116 is formed to a certain slope by a chamfer process.

The lower polarizing film 118 is adhered to the rear surface of the lower substrate 112 and polarizes light that is irradiated from the backlight unit 120 onto the display panel 110.

The display panel 110 further includes a plurality of circuit films (not shown) connected to a pad part (not shown) that is prepared at a first long side of first and second long sides of the lower substrate 112, and a Printed Circuit Board (PCB) that is connected to the circuit films.

A data driving Integrated Circuit (IC) 345 for supplying data signals to the display panel 110 are mounted on each of the circuit films. Furthermore, a gate driving circuit (not shown) for supplying a gate (scan) signal to the display panel 110 is formed at the lower substrate 112 of the display panel 110 by a thin film transistor manufacturing process. The circuit films may be adhered to the pad part of the display panel 110 and the PCB by a Tape Automated Bonding (TAB) process, and may be a Tape Carrier Package (TCP) or Chip On Flexible Board/Chip On Film (COF). Therefore, the display panel 110 is electrically connected to the PCB by the circuit films.

The PCB is electrically connected to the circuit films and supplies various signals for displaying an image to the display panel 110. A timing controller (not shown) for controlling driving of the display panel 110, various power source circuits (not shown), a memory element (not shown), etc. are mounted on the PCB.

The backlight unit 120 includes a light guide panel 122 that is placed in the panel supporting member 130, a reflective sheet 124, and a optical member 126.

The light guide panel 122 is formed in a flat type (or a wedge type) and guides light, inputted from a light source (not shown) through a light incident surface, to the display panel 110. Herein, the light source may include a fluorescent lamp or a Light Emitting Diode (LED).

The reflective sheet 124 is disposed at a rear surface of the light guide panel 152 and reflects light, incident thereon from the light guide panel 122, to the display panel 110.

The optical member 126 is disposed on the light guide panel 122 and enhances the luminance characteristic of light traveling from the light guide panel 122 to the display panel 110. For this end, the optical member 126 may include at least one diffusive sheet and one prism sheet of a lower diffusive sheet, a lower prism sheet, an upper prism sheet, and an upper diffusive sheet.

The panel supporting member 130 supports the display panel 110 to expose a front surface of the upper polarizing film 116 and a side of the display panel 110 to the outside. For this end, the panel supporting member 130 includes a set cover 131, a supporting cover 133, and a guide frame 135.

The set cover 131 is formed in a "U"-shape to have a receiving space to receive the supporting cover 133 and guide frame 135 and support a rear edge of the display panel 110. The set cover 131 may be formed of a plastic material or a metal material, for example, formed of a metal material for enhancing a sense of beauty of the produced display device. For this end, the set cover 131 includes a set plate 131a and a set side wall 131b.

The set plate 131a acts as a rear cover of the display device that is produced in a flat type.

The set side wall 131b is bent vertically from an edge portion of the set plate 131a to form a receiving space. The set side wall 131b is formed to surround the side of the guide frame 135 and acts as a side cover of a produced display device.

The supporting cover 133 is placed in the receiving space of the set cover 131 to support the guide frame 135 and receive the backlight unit 120. For this end, the supporting cover 133 includes a cover plate that supports the backlight unit 120, and a supporting side wall that is bent vertically from an edge of the cover plate. The supporting cover 133 may be coupled to the set cover 131 through the set plate 131a by a plurality of screws that are coupled to the cover plate.

The guide frame 135 is formed in a tetragonal frame shape to have a "⊓"-shaped sectional surface, disposed at the supporting cover 133, and coupled to the rear surface of the display panel 110 by the panel coupling member 140. For this end, the guide frame 135 includes a coupling member forming part 135a, and a guide side wall 135b that is bent vertically from the coupling member forming part 135a and coupled to the set side wall 131b.

The coupling member forming part 135a is formed in a plate shape to face a rear edge portion of the display panel 110. Herein, the coupling member forming part 135a includes a groove having a certain depth in order for the panel coupling member 140 to be easily formed.

The guide side wall 135b is bent vertically from one side of the coupling member forming part 135b adjacent to the set side wall 131b, disposed a space between the supporting side wall of the supporting cover 133 and the set side wall 131b, and coupled to the set side wall 131b.

To couple the guide frame 135 and the set cover 131, the display device 10 further includes a first coupling member 131c that is formed at the set cover 131, a second coupling member 135c that is formed at the guide frame 135.

For example, the first coupling member 131c is formed concavely to have a certain depth from an inner side wall of the set side wall 131b, in correspondence with the second coupling member 135c. The second coupling member 135c is formed to protrude from an outer side wall of the guide side wall 135b and have a stepped surface and an inclined surface. Herein, the stepped surface prevents the deviation of the second coupling member 135c coupled to the first coupling member 131c, and the inclined surface facilitates coupling of the first and second coupling members 131c and 135c.

The guide frame 135 and the set cover 131 have been described above as being mutually coupled, but the embodiment is not limited thereto. In terms of design of the display device 10, the guide frame 135 may be coupled to the supporting side wall of the supporting cover 133. In this case, the set cover 131 may be coupled to the supporting cover 133 through the set plate 131a by the screws that are coupled to the cover plate of the supporting cover 133.

The panel coupling member 140 is formed at the coupling member forming part 135a of the guide frame 135 and couples the display panel 110 and the panel supporting member 130. Herein, the panel coupling member 140 may be coupled to the lower substrate 112 of the display panel 110 in consideration of a coupling strength and thickness of the display panel 110 and the guide frame 135, but the embodiment is not limited thereto. As another example, the panel coupling member 140 may be coupled to the lower polarizing film 118. The panel coupling member 140 may be a double-sided tape or an adhesive (for example, a glue, an instant adhesive, a thermosetting adhesive, or a photocurable adhesive).

In the display device 10, the panel coupling member 140 couples the display panel 110 to the panel supporting member 130, and thus, an upper case and a front set cover are removed from general display devices. A step height is removed from a border portion of the display panel 110, thus minimizing a thickness and enhancing a sense of beauty in terms of design.

The display device 10 has been described above as configuring a display product with the display panel 110 and the backlight unit 120. However, in the display device 10, the display panel 110 may be replaced by an organic light emitting display panel including a plurality of organic light emitting elements. In this case, the organic light emitting display panel is a self-emitting element, and thus, the backlight unit 120 placed in the panel supporting member 130 is not provided, and moreover, the supporting cover 133 of the panel supporting member 130 may not be provided.

The display panel 110 including the organic light emitting display panel includes the lower substrate 112, the upper substrate 114 facing-coupled to the lower substrate 112, and the upper polarizing film 116 adhered to the upper substrate 114.

The lower substrate 112 includes a plurality of light emitting cells formed in respective regions that are defined by a plurality of gate lines, data lines, and power (VDD) lines. Each of the light emitting cells includes at least one switching transistor that is connected to a gate line and data line, at least one driving transistor that is connected to the switching transistor and a power (VDD) line, and a light emitting element that emits light with a current that is controlled according to switching of the driving transistor.

The upper substrate 114 is facing-coupled to the lower substrate 112, and protects a plurality of light emitting elements that are formed at the lower substrate 112. Herein, the upper substrate 114 may include a plurality of light emitting elements that are respectively connected to a plurality of driving transistors formed at the lower substrate 112, in which case the light emitting elements formed at the lower substrate 112 are not provided.

The upper polarizing film 116 is adhered to entire one surface of the upper substrate 114 and polarizes light that is emitted to the outside through the upper substrate 114. The upper polarizing film 116 is formed to have the same size as that of the front surface of the upper substrate 14 and adhered to the entire one surface of the upper substrate 114, by a cutting process. Each side of the upper polarizing film 116 is formed to a certain slope by a chamfer process. The upper polarizing film 116 may not be provided, in which case the upper polarizing film 116 may be replaced by a protective film (not shown) for protecting the upper substrate 114 because the upper substrate 114 is exposed to the outside.

The upper polarizing film 116, the protective film, and a Three-Dimensional (3D) optical film (not shown) may be combined and adhered to the upper substrate 114 of the display panel 110 according to whether the display panel 110 is a liquid crystal display panel, an organic light emitting display panel, or a 3D display panel. Therefore, in the following description, the combination of the upper polarizing film 116, protective film, and 3D optical film adhered to the upper substrate 114 is defined as at least one upper film.

Figure 3:
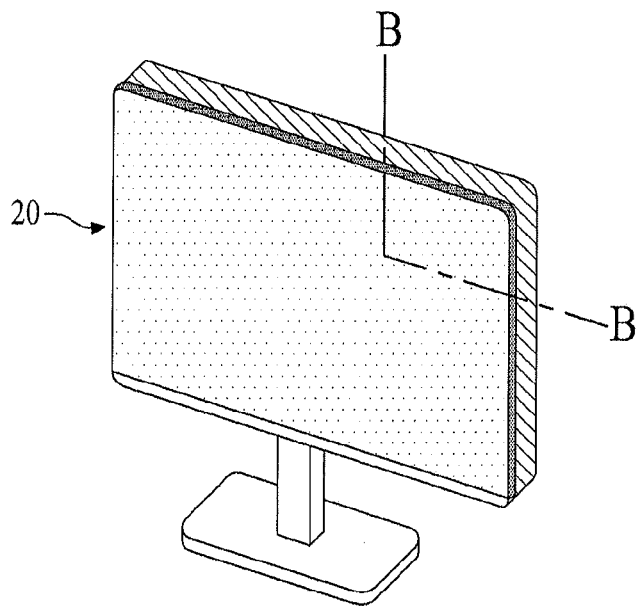
FIG. 3 is a view illustrating a display device according to a second embodiment of the present invention.
Figure 4:
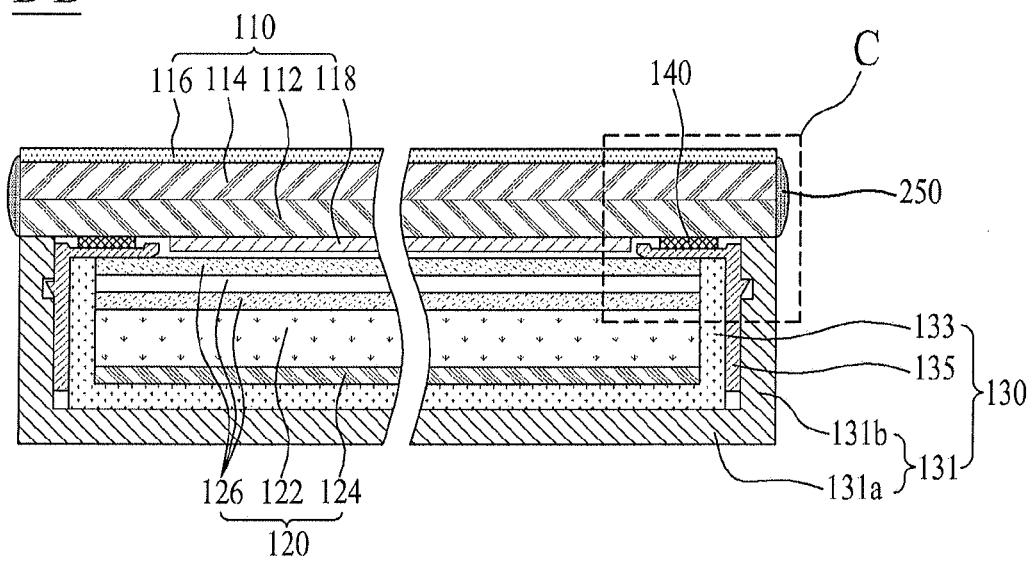
FIG. 4 is a sectional view illustrating a sectional surface taken along line B-B of FIG. 3.

FIG. 3 is a view illustrating a display device according to a second embodiment of the present invention. FIG. 4 is a sectional view illustrating a sectional surface taken along line B-B of FIG. 3.

Referring to FIGS. 3 and 4, a display device 20 according to the second embodiment of the present invention includes a display panel 110 including a facing-coupled lower substrate 112 and upper substrate 114, a backlight unit 120 that irradiates light on the display panel 110, a panel supporting member 130 that receives the backlight unit 120 and supports the display panel 110 in order for a front surface and side of the display panel 110 to be exposed to the outside, a panel coupling member 140 that couples the display panel 110 and the panel supporting member 130, and a sealing member 250 that is formed at an edge part of the display panel 110 and protects the edge part of the display panel 110. Except for the sealing member 250, the display device 20 having such a configuration has the same configuration as that of the display device 10 of the first embodiment, and thus, the above description of the first embodiment is applied to the second embodiment. Like reference numerals refer to like elements throughout.

The sealing member 250 is formed at a second long side of the display panel 110 and an edge part of the display panel 110 corresponding to first and second short sides thereof. Herein, a plurality of circuit films are adhered to an edge portion of a first long side of the display panel 110. This portion is surrounded by a separate element (not shown). Therefore, the sealing member 250 is not required to be formed at an edge part of the display panel 110 corresponding to the first long side of the display panel 110. The sealing member 250 may be formed of a silicon-based sealant, ultraviolet (UV) curable sealant (or resin), or light blocking resin, but considering a process tack time, the sealing member 250 may be formed of the UV curable sealant. Viscosity of a sealant may be within about 1500 cps to about 30,000 cps, but is not limited thereto. The viscosity may be selected according to a shape process time. Also, a sealant may be colorless (or transparent) or colored (for example, blue, red, bluish green, or black), but is not limited thereto. Color of the sealant may be selected according to the design of a display device.

Figure 5:
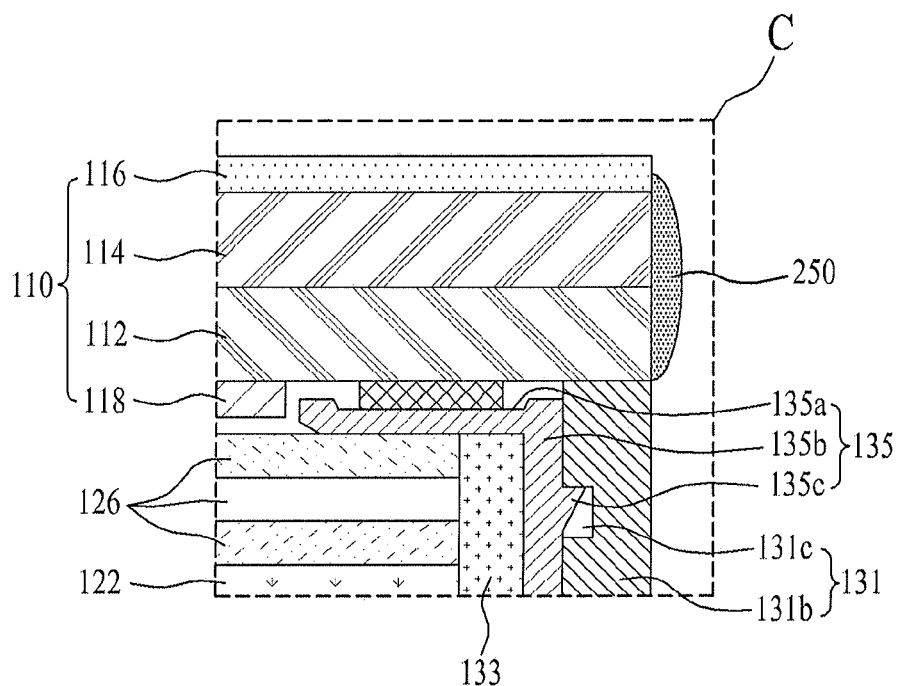
FIG. 5 is a view for describing a first embodiment of a sealing member of FIG. 3.

A sealing member 250 according to a first embodiment, as illustrated in FIG. 5, is formed at an edge part of the display panel 110 that includes an entire side of the lower substrate 112, an entire side of the upper substrate 114, and a portion of a side of an upper polarizing film 116 adjacent to the upper substrate 112.

Figure 6:
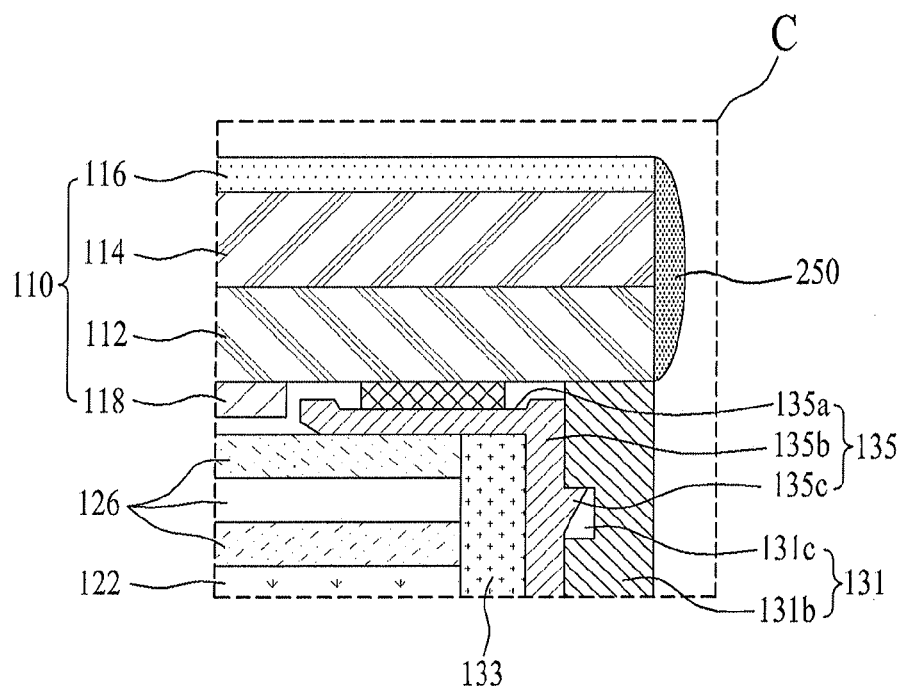
FIG. 6 is a view for describing a second embodiment of the sealing member of FIG. 3.

A sealing member 250 according to a second embodiment, as illustrated in FIG. 6, is formed at an edge part of the display panel 110 that includes an entire side of the lower substrate 112, an entire side of the upper substrate 114, and an entire side of the upper polarizing film 116.

Figure 7:
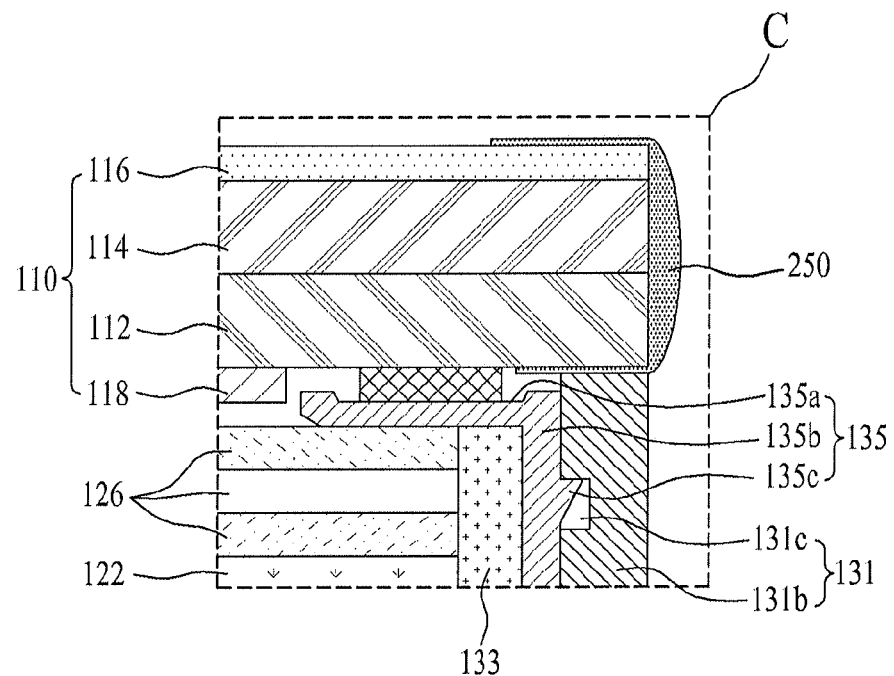
FIG. 7 is a view for describing a third embodiment of the sealing member of FIG. 3.

A sealing member 250 according to a third embodiment, as illustrated in FIG. 7, is formed at an edge part of the display panel 110 that includes a top edge portion and entire side of the upper polarizing film 116, an entire side of the lower substrate 112, an entire side of the upper substrate 114, and a rear edge portion of the lower substrate 112.

Even when the display panel 110 is an organic light emitting display panel and a protective film instead of the upper polarizing film 116 is adhered to the upper substrate 114 of the organic light emitting display panel, the sealing member 250 is formed at a top edge portion and entire side of the protective film, a portion of a side of the protective film, or an entire side of the protective film.

The sealing member 250 according to the first to third embodiment is formed at the edge part of the display panel 110, and thus, an upper case and a front set cover are removed from general display devices. Accordingly, the edge part of the display panel 110 exposed to the outside is protected from an external environment or an external force. That is, the sealing member 250 is formed in the edge part of the display panel 110 has at least the following advantages: 1) enhancing the endurance of display panel 110 by preventing the display panel 110 exposed to the outside from being damaged by the external force; 2) preventing the upper film from being peeled off; 3) preventing a user from being injured when using the display panel 110 exposed to the outside; 4) preventing moisture from being permeated into the inside of the display panel 110; and 5) preventing light from leaking in the lateral side by the light total reflection occurring inside the display panel 110.

Thus, the display device 20 according to the second embodiment may provide the same effect as that of the display device 20 according to the first embodiment, and furthermore, prevents the damage of the display panel 110, the peeling-off of the upper film, moisture permeation, and the light leakage at the lateral side by the use of the sealing member 250 formed in the edge part of the display panel 110.

Figure 8:
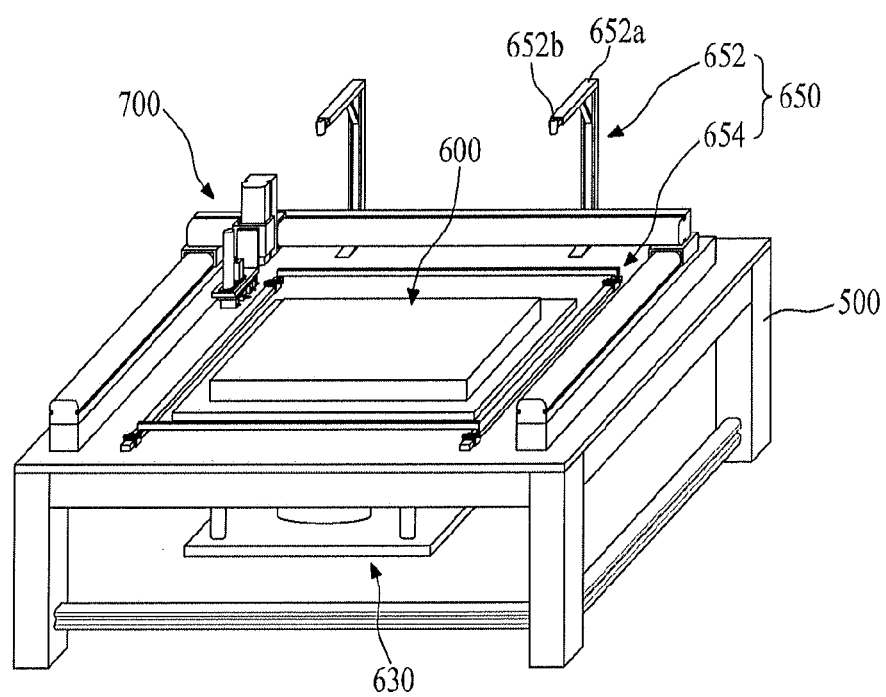
FIG. 8 is a perspective view for describing a display manufacturing apparatus according to a first embodiment of the present invention for forming a sealing member of a display device according to a second embodiment of the present invention.
Figure 9:
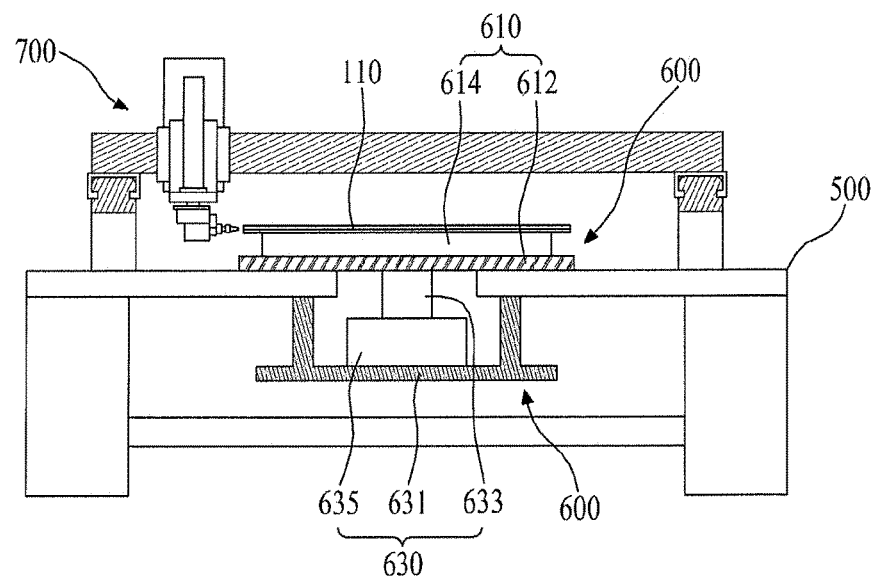
FIG. 9 is a side view of the display manufacturing apparatus of FIG. 8 according to the first embodiment of the present invention.
Figure 10:
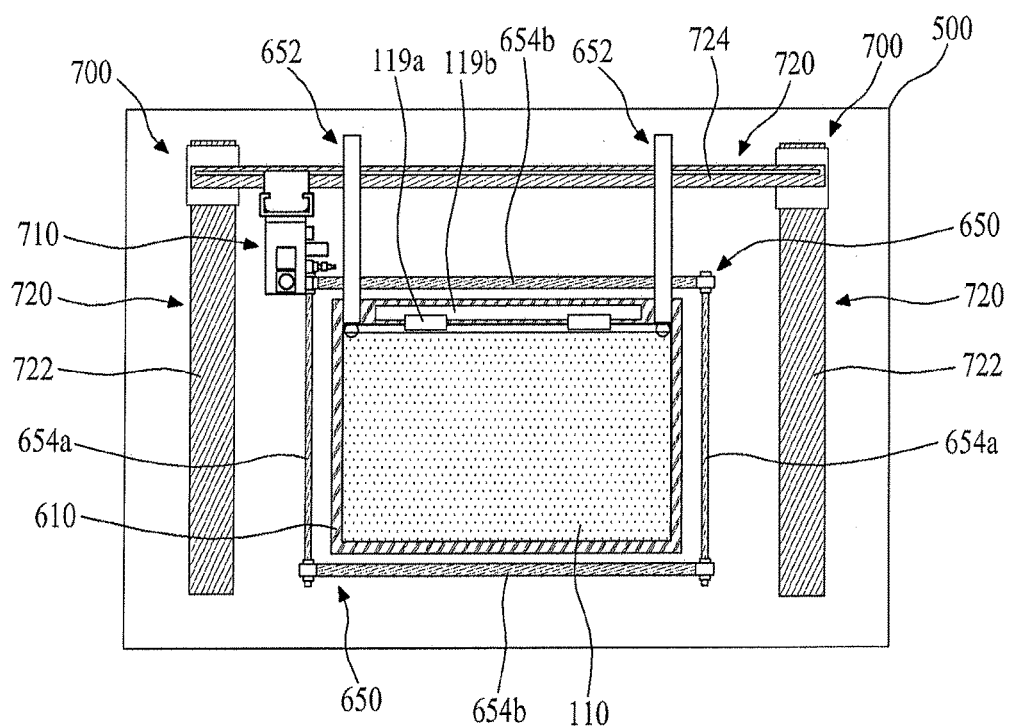
FIG. 10 is a plan view of the display manufacturing apparatus of FIG. 8 according to the first embodiment of the present invention.

FIG. 8 is a perspective view for describing a display manufacturing apparatus according to a first embodiment of the present invention for forming a sealing member of a display device according to a second embodiment of the present invention. FIG. 9 is a side view of the display manufacturing apparatus of FIG. 8 according to the first embodiment of the present invention. FIG. 10 is a plan view of the display manufacturing apparatus of FIG. 8 according to the first embodiment of the present invention.

Referring to FIGS. 4 and 8 to 10, a display manufacturing apparatus according to the first embodiment of the present invention includes a panel supporting part 600 that is provided at a base frame 500 and supports a display panel 110, and a sealing member forming part 700 that forms the sealing member 250 at an edge part of the display panel 110 supported by the panel supporting part 600.

First, the display panel 110 may be a liquid crystal display panel or an organic light emitting display panel.

A display panel 110 according to an embodiment includes the lower substrate 112, the upper substrate 114 that is facing-coupled to the lower substrate 112 with the liquid crystal layer (not shown) therebetween, the upper polarizing film 116 adhered to the upper substrate 114, and the lower polarizing film 118 adhered to a rear surface of the lower substrate 112. The display panel 110 according to an embodiment may further include a 3D optical film (not shown) adhered to the upper polarizing film 116.

A display panel 110 according to another embodiment includes the lower substrate 112, the upper substrate 114 that is facing-coupled to the lower substrate 112, and the upper polarizing film 116 adhered to the upper substrate 114. The lower polarizing film 118 may be replaced by a protective film. The display panel 110 according to another embodiment may further include a 3D optical film (not shown) adhered to the upper polarizing film 116 or the upper substrate 114.

The upper polarizing film 116, a protective film, and a 3D optical film (not shown) may be combined and adhered to the upper substrate 114 of the display panel 110 according to whether the display panel 110 is a liquid crystal display panel, an organic light emitting display panel, or a 3D display panel. Therefore, in the following description, the combination of the upper polarizing film 116, protective film, and 3D optical film adhered to the upper substrate 114 is defined as at least one upper film.

The display panel 110 further includes a plurality of circuit films 119a adhered to a pad part (not shown) that is prepared at a first long side of first and second long sides of the lower substrate 112, and a PCB 119b that is connected to the circuit films 119a.

The base frame 500 includes a flat type base plate, and a plurality of supports that support the base plate.

The panel supporting part 600 is provided at the base frame 500 and supports the display panel 110. For this end, the panel supporting part 600 includes a stage 610 that supports the display panel 110, and a stage supporting unit 630 that supports the stage 610.

The stage 610 is disposed on the base plate to be supported by the stage supporting unit 630, and supports the display panel 110 loaded from the outside. For this end, the stage 610 may include a work table 612 supported by the stage supporting unit 630, and a protruding portion 614 that is formed on the work table 612 to have a certain height and supports the display panel 110.

The work table 612 is disposed on the base plate to be supported by the stage supporting unit 630. Herein, the work table 612 may ascend by the stage supporting unit 630. In this case, the work table 612 may ascend (or descend) to a panel loading position in loading the display panel 110, and when the display panel 110 has been disposed at the protruding portion 614, the work table 612 may descend (or ascend) to a process position.

The protruding portion 614 protrudes by a certain height from the work table 612 to have an area less than that of the display panel 110, and supports the display panel 110 loaded from the outside. Herein, the protruding portion 614 supports portions other than a rear edge portion of the display panel 110, thereby allowing the edge part of the display panel 110 to be exposed to the outside.

The panel supporting part 600 may further include a plurality of vacuum absorbing holes (not shown) that are formed at the protruding portion 614 and vacuum-absorb the display panel 110. Also, the panel supporting part 600 may further include a plurality of lift pins (not shown) that are provided at the protruding portion 614 so as to enable ascending, temporarily support the display panel 110 loaded thereon, and dispose the supported display panel 110 at the protruding portion 614.

The stage supporting unit 630 is disposed under the base plate and supports the stage 610. For this end, the stage supporting unit 630 may include a shelf 631, a supporting shaft 633, and a driving part 635.

The shelf 631 is disposed to be separated from a rear surface of the base plate by a certain distance, and supports the driving part 635.

The supporting shaft 633 passes through the base plate and is coupled to a rear surface of the work table 612 of the stage 610.

The driving part 635 is disposed at the shelf 631 to be coupled to the supporting shaft 633. The driving part 635 lifts the supporting shaft 633. Therefore, the stage 610 coupled to the supporting shaft 633 ascends according to driving of the driving part 635. The driving part 635 may rotate the supporting shaft 633 according to a method of forming the sealing member 250 that is performed by the sealing member forming part 700. Therefore, the stage 610 coupled to the supporting shaft 633 rotates according to driving of the driving part 635.

The display manufacturing apparatus according to the first embodiment of the present invention further includes a panel aligning part 650 for aligning the position of the display panel 110 supported by the stage 610.

The panel aligning part 650 includes a mark detecting unit 652 that detects an alignment mark (not shown) formed at the display panel 110, and a panel aligning unit 654 that aligns the position of the display panel 110 on the basis of the position of the alignment mark detected by the mark detecting unit 652.

The mark detecting unit 652 includes a pair of vertical supports 652a that are disposed on the base frame 500 to have a certain height in correspondence with the alignment mark (not shown) formed at the display panel 110, and a mark capturing unit 652b that is disposed at each of the pair of vertical supports 652a and captures a corresponding alignment mark.

The panel aligning unit 654 includes a pair of aligning guiders 654a, and a pair of panel aligning bars 654b.

The pair of aligning guiders 654a are disposed about the stage 610 in parallel to each other. For example, the pair of aligning guiders 654a may be disposed to be adjacent to a short side or long side of the stage 610.

The pair of panel aligning bars 654b are disposed about the display panel 110 so as to enable moving between the pair of aligning guides 654a. On the basis of the position of an alignment mart detected by the mark detecting unit 652, the pair of panel aligning bars 654b slide a side of the display panel 110 disposed at the stage 610 to align an alignment mark formed at the display panel 110 to a reference position, thereby aligning the position of the display panel 110.

The sealing member forming part 700 coats a sealant on an edge part of the display panel 110 supported by the stage 610, and then forms the sealing member 250 at the edge part of the display panel 110 by curing the sealant. For this end, the sealing member forming part 700 includes a sealing unit 710 that forms the sealing member 250 at the edge part of the display panel 110, and a moving unit 720 that moves the sealing unit 710.

Figure 11:
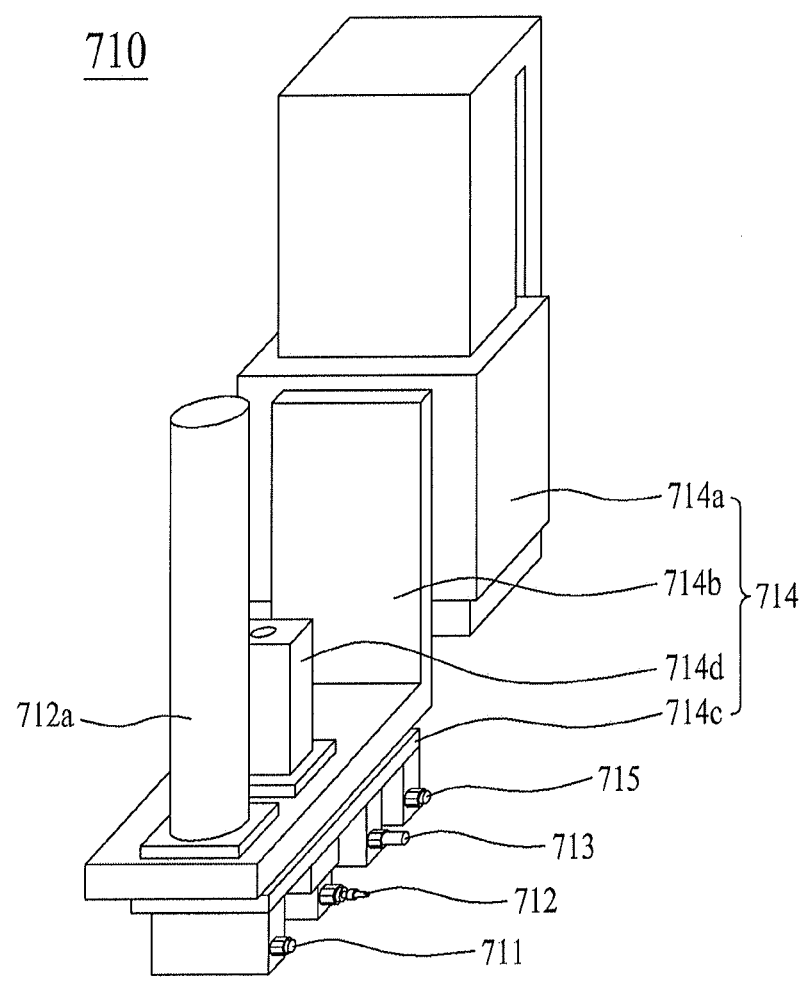
FIG. 11 is a view for describing a first embodiment of a sealing unit of FIG. 8.

The sealing unit 710, as illustrated in FIG. 11, includes a detecting member 711, a coating member 712, a curing member 713, and a supporting module 714.

The detecting member 711 is supported by the supporting module 714 and detects an edge part of the display panel 110 that is intended to be coated with the sealing member 250. For example, the detecting member 711 may detect a side of the display panel 110, namely, a side of the upper substrate 114 with a laser.

The coating member 712 is supported by the supporting module 714 to face an edge part of the display panel 110 and coats a sealant on the edge part of the display panel 110 that has been detected by the detecting member 711. For this end, the coating member 712 includes a spray nozzle and a syringe 712a, The spray nozzle is disposed at the supporting module 714 to face the edge part of the display panel 110. The spray nozzle coats a sealant, supplied from the syringe 712a, on the edge part of the display panel 110 and thus allows the sealing member 250 of any one of the first to third embodiments, respectively illustrated in FIGS. 5 to 7, to be formed at the edge part of the display panel 110. Herein, the spray nozzle may coat a sealant on the edge part of the display panel 110, in a jetting process or an air pressure process.

A spray nozzle according to an embodiment is formed to have a "-"-shaped sectional surface, and by coating a sealant on the edge part of the display panel 110, the spray nozzle allows the sealing member 250 of the first embodiment of FIG. 5 or the second embodiment of FIG. 6 to be formed at the edge part of the display panel 110.

Figure 12:
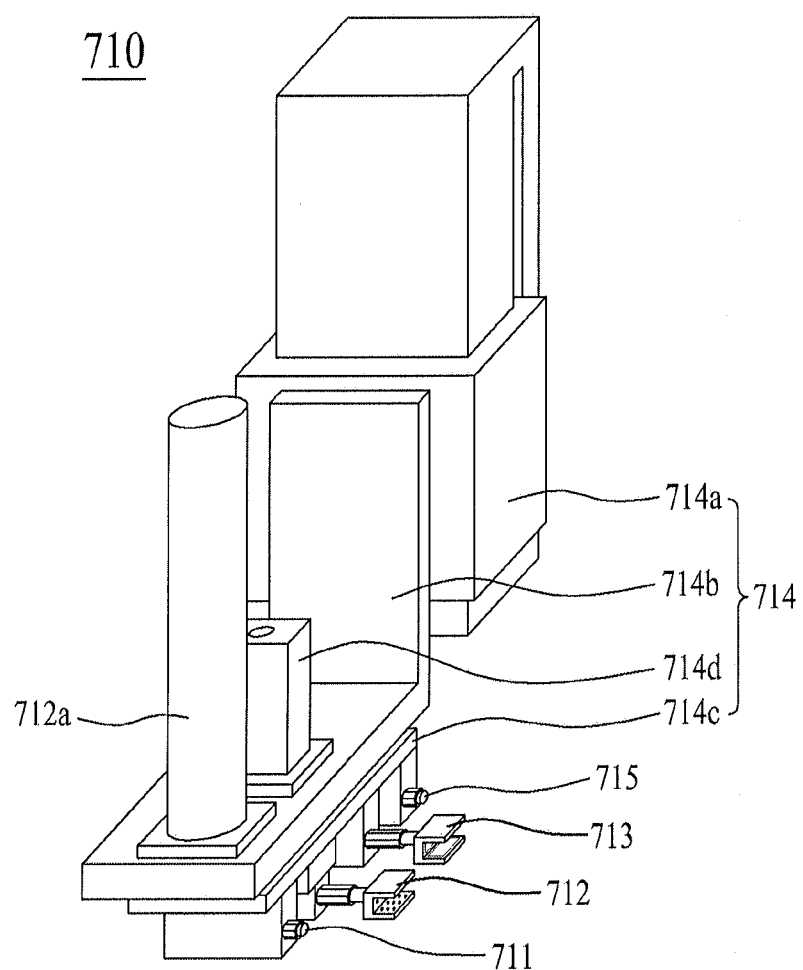
FIG. 12 is a view for describing a second embodiment of the sealing unit of FIG. 8.

A spray nozzle according to another embodiment, as illustrated in FIG. 12, is formed to have a "⊂"-shaped sectional surface and allows the sealing member 250 of the third embodiment of FIG. 7 to be formed at the edge part of the display panel 110. That is, the spray nozzle according to another embodiment is formed to have the "⊂"-shaped sectional surface and an inserting space into which the edge part of the display panel 110 is inserted, and allows the sealing member 250 of the third embodiment to be formed at the edge part of the display panel 110.

The syringe 712a is disposed at the supporting module 714 to be connected to the spray nozzle. The syringe 712a stores a certain amount of sealant and supplies the stored sealant to the spray nozzle. The sealant may be a silicon-based sealant, ultraviolet (UV) curable sealant (or resin), or light blocking sealant, but considering the process tack time, the sealant member 250 may be the UV curable sealant. In this case, a time taken in curing a sealant may be within about 5 sec, and a curing contraction percentage may be within about 5%. Also, viscosity of a sealant may be within about 1500 cps to about 30,000 cps, but is not limited thereto. The viscosity may be selected according to the shape process time. Furthermore, a sealant may be colorless (or transparent) or colored (for example, blue, red, bluish green, or black), but is not limited thereto. Color of the sealant may be selected according to the design of a display device.

The curing member 713 is supported by the supporting member 714 adjacently to the coating member 712 and cures the sealant, coated on the edge part of the display panel 110 by the coating member 712, while moving together with the coating member 712. At this point, the curing member 713 cures the coated sealant within about 5 sec from a time when the sealant is coated by the coating member 712. For this end, the curing member 713 irradiates UV light or heat of a certain temperature on the sealant according to the curing characteristic of the sealant. For example, the sealant is formed of a UV curable resin, and the curing member 713 irradiates UV light on the UV curable resin.

The supporting module 714 supports the detecting member 711, coating member 712, and curing member 713 and simultaneously moves the detecting member 711, coating member 712, and curing member 713 according to driving of the moving unit 720. For this end, the supporting module 714 includes a lifting member 714a, a supporting bracket 714b, a supporting frame 714a, and a rotating member 714d.

The lifting member 714a is ascendably disposed at the moving unit 720 and ascendably supports the supporting bracket 714b. For this end, the lifting member 714a may lift the supporting bracket 714b in a cylinder scheme using a hydraulic cylinder or a pneumatic cylinder, a ball screw scheme using a motor and a ball screw, a gear scheme using a motor, rack gear, and pinion gear, a belt scheme using a motor, pulley, and belt, or a linear motor scheme. For example, when the coating member 712 forms the sealing member 250 of the first or second embodiment at the edge part of the display panel 110, the lifting member 714a may lift the supporting bracket 714b such that a discharge opening of the spray nozzle is disposed at a side center portion of the display panel 110 or between the side center portion and top of the display panel 110.

The supporting bracket 714b is disposed at the lifting member 714a and supports the rotating member 714d and the syringe 712a. For this end, the supporting bracket 714b may be formed to have a "L"-shaped sectional surface.

The supporting frame 714c is disposed under the supporting bracket 714b, supported rotatably by the rotating member 714b, and supports the detecting member 711, coating member 712, and curing member 713. For this end, the supporting frame 714c is formed in a plate shape.

The rotating member 714d is disposed at the supporting bracket 714b to be coupled to the supporting frame 714c and supports the supporting frame 714c. That is, the rotating member 714d rotates the spray nozzle, spaying a sealant, by about 90 degrees to face the edge part of the display panel 110.

The sealing unit 710, as illustrated in FIG. 11 or 12, may further include a capturing member 715.

The capturing member 715 is disposed under the supporting module 714, namely, the supporting frame 714c to be adjacent to the curing member 713. The capturing member 715 captures the sealing member 250, which is cured and formed by the curing member 713, to check the shape of the sealing member 250 in real time. That is, the capturing member 715 captures the sealing member 250, which is formed at the edge part of the display panel 110, to generate the forming state information of the sealing member 250, namely, the shape information of the sealing member 250 in real time. The shape information of the sealing member 250 generated by the capturing member 715 may be supplied to an image analyzing member (not shown). The image analyzing member may analyze the shape information of the sealing member 250 to detect a width or thickness of the sealing member 250 or supply information regarding the disconnection of the sealing member 250 to a user.

Referring again to FIGS. 8 to 10, the moving unit 720 moves the sealing unit 710 in an X-axis direction and/or a Y-axis direction, and thus allows the sealing unit 710 to form the sealing member 250 at the edge part of the display panel 110. For this end, the moving unit 720 includes first and second gantries 722 and 724.

The first gantry 722 is disposed in parallel to the base member 500 with the display panel 110 therebetween, and moves the second gantry 724 in the Y-axis direction. The first gantry 722 may use a ball screw scheme using a motor and a ball screw, a gear scheme using a motor, rack gear, and pinion gear, or a linear motor scheme. For example, the first gantry 722 uses the linear motor scheme.

The second gantry 724 is movably disposed at the first gantry 722, supports the sealing unit 710 movably, and moves the sealing unit 710 in the X-axis direction. The second gantry 724 may use the ball screw scheme using a motor and a ball screw, the gear scheme using a motor, rack gear, and pinion gear, or the linear motor scheme. For example, the second gantry 724 uses the linear motor scheme.

Figure 13:
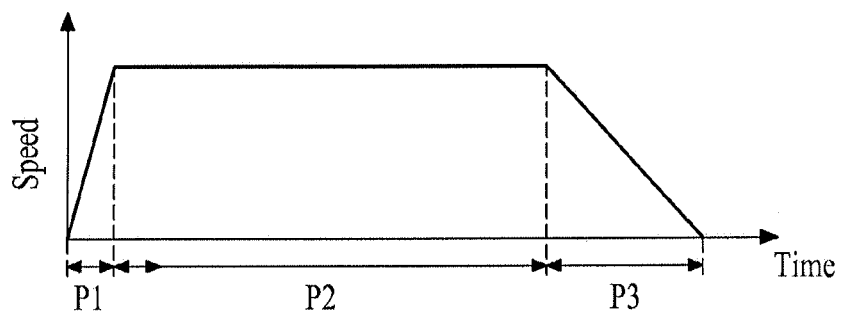
FIG. 13 is a view for describing a moving speed of the sealing unit based on driving of a moving unit of FIG. 8.
Figure 14A:
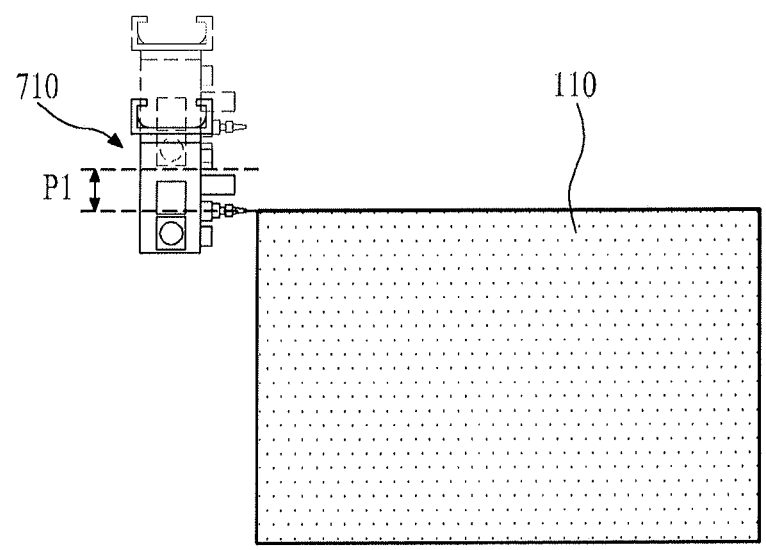
FIGS. 14A to 14C are views for describing moving of the sealing unit based on driving of the moving unit of FIG. 8.
Figure 14B:
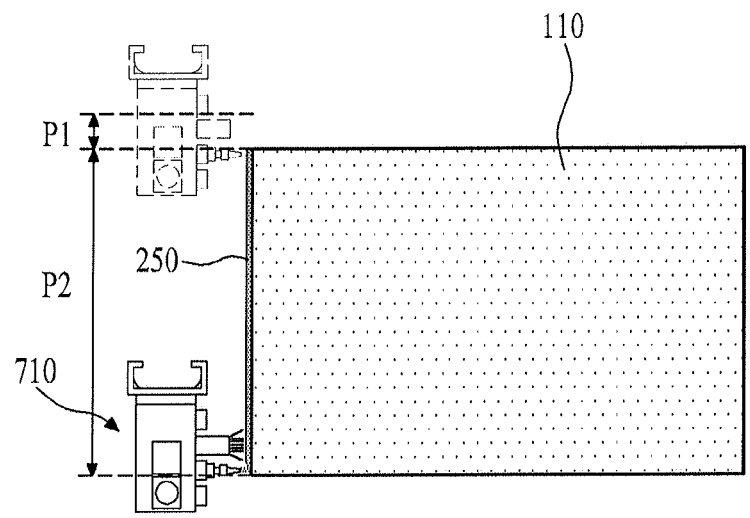
Figure 14C:
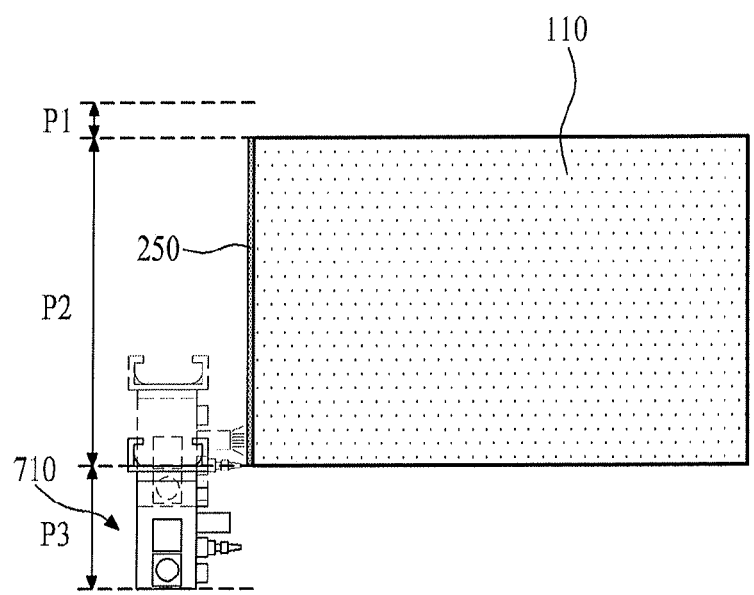

The moving unit 720, as illustrated in FIG. 13, separately moves the sealing unit 710 according to a speed accelerating period P1, a constant speed period P2, and a speed reducing period P3. Herein, the speed accelerating period P1 denotes a period where a moving speed is accelerated to a desired moving speed at a driving time, the constant speed period P2 denotes a period where a constant moving speed is maintained, and the speed reducing period P3 denotes a period where a constant moving speed is reduced to a speed of a stop state. Therefore, as illustrated in FIG. 14A, the sealing unit 710 is moved from a home position to the edge part of the display panel 110 at an accelerated speed according to driving of the moving unit 720. The sealing unit 710, as illustrated in FIG. 14B, is moved at a constant speed and forms the sealing member 250 ranging from one side of the edge part of the display panel 110 to the other side thereof. The sealing unit 710, as illustrated in FIG. 14C, is moved at a reduced speed and then stopped at the other side of the edge part of the display panel 110. At this point, the coating member 712 of the sealing unit 710 sprays the sealant while the detecting member 711 is detecting the edge part of the display panel 110. As a result, the sealing unit 710 forms the sealing member 250 at the edge part of the display panel 110 only during the constant speed period P2 while being moved by the moving unit 720.

FIGS. 15A to 15F are views for sequentially describing a method which forms a sealing member of the display device according to the second embodiment of the present invention by using the display manufacturing apparatus according to the first embodiment of the present invention.

The method, which forms the sealing member of the display device according to the second embodiment of the present invention by using the display manufacturing apparatus according to the first embodiment of the present invention, will be sequentially described below with reference to FIGS. 4 and 15A to 15F.

Figure 15A:
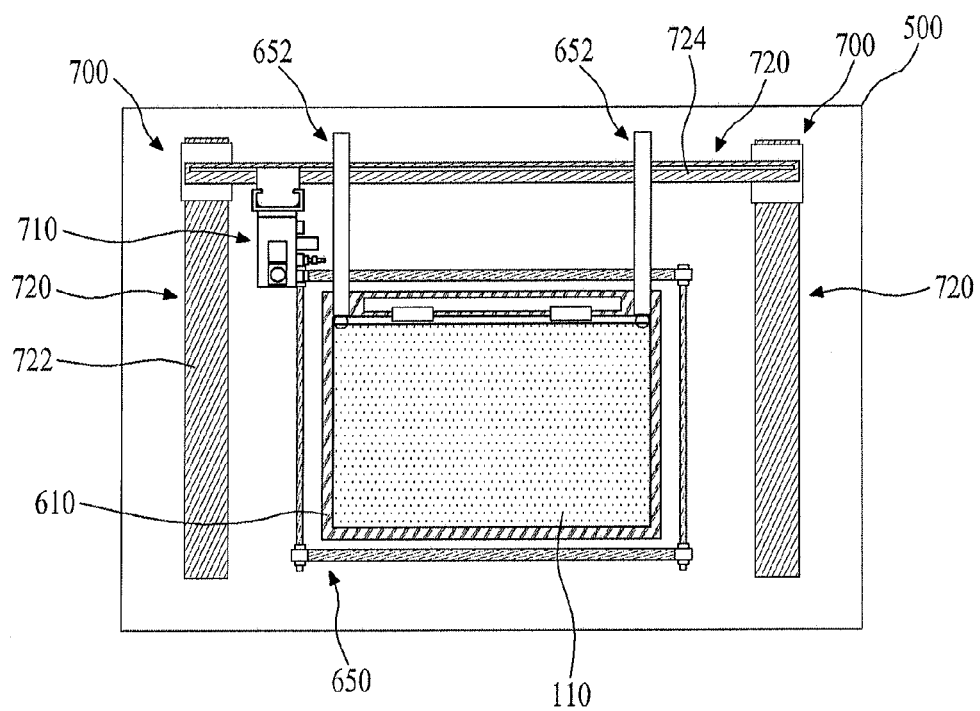
FIGS. 15A to 15F are views for sequentially describing a method which forms a sealing member of the display device according to the second embodiment of the present invention by using the display manufacturing apparatus according to the first embodiment of the present invention.

First, as illustrated in FIG. 15A, the display panel 110 is disposed at the stage 610 of the panel supporting part 600, and thereafter the position of the display panel 110 disposed at the stage 610 is aligned according to driving of the panel aligning part 650.

Figure 15B:
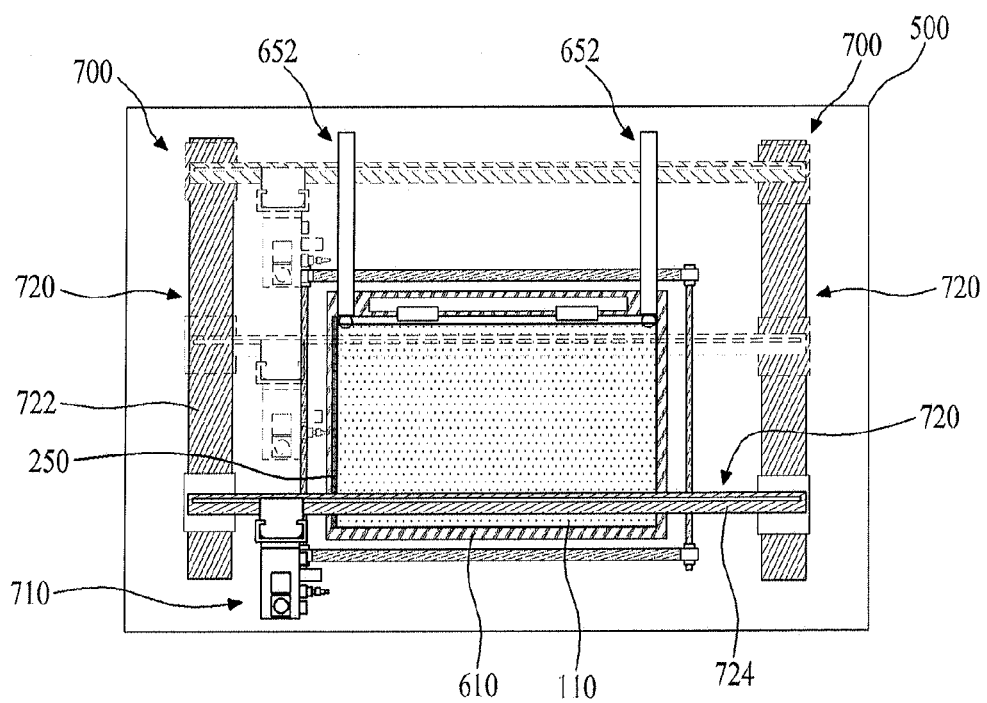

Subsequently, as illustrated in FIG. 15B, the display manufacturing apparatus forms the sealing member 250 at an edge portion corresponding to a first short side of the display panel 110 while moving the sealing unit 710 from a home position thereof to the other side of the first short side of the display panel 110, according to driving of the first gantry 722 of the moving unit 720. At this point, the sealing unit 710 coats a sealant on the edge portion corresponding to the first short side of the display panel 110 during a constant speed period of the moving unit 720 by using the coating member 712, and cures the coated sealant with the curing member 713 to form the sealing member 250 at the edge portion corresponding to the first short side of the display panel 110.

Figure 15C:
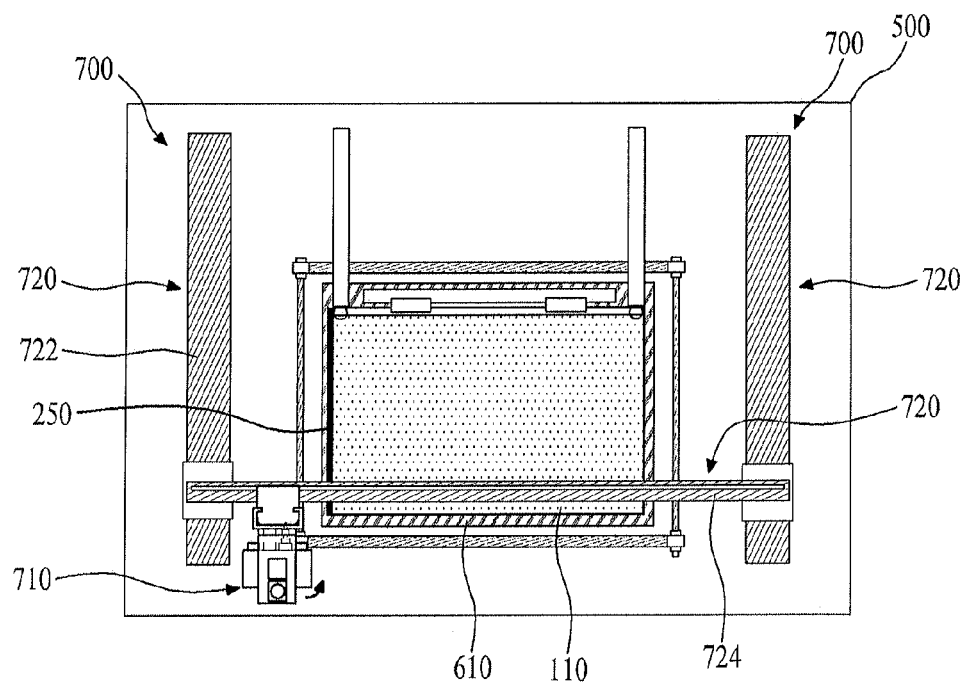

Afterward, as illustrated in FIG. 15C, the display manufacturing apparatus counterclockwise rotates the sealing unit 710, disposed at the other side of the first short side of the display panel 110, by about 90 degrees.

Figure 15D:
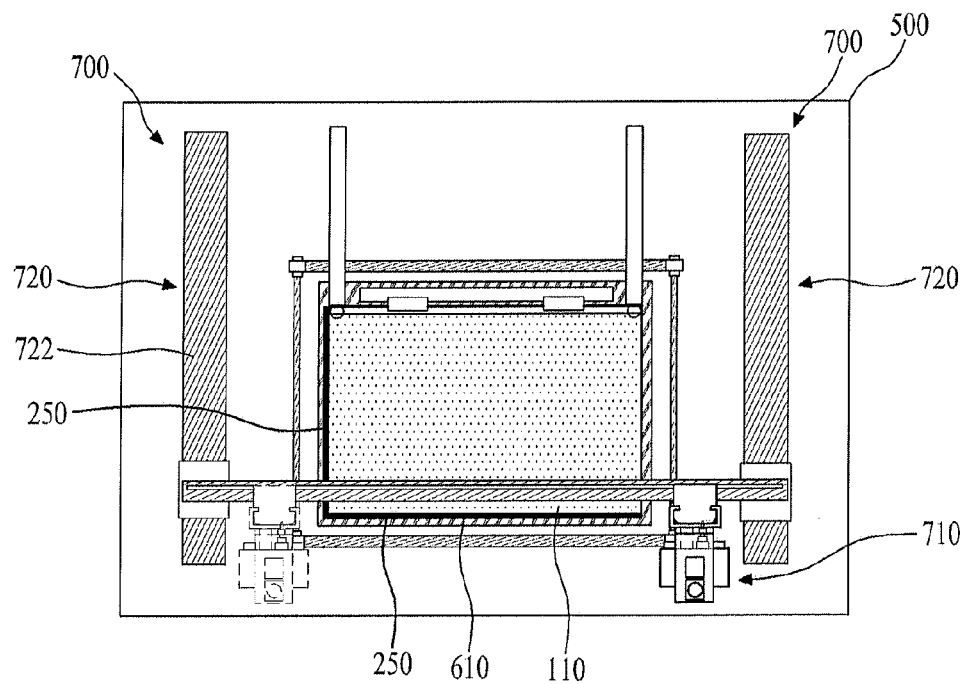

Thereafter, as illustrated in FIG. 15D, the display manufacturing apparatus forms the sealing member 250 at an edge portion corresponding to a second long side of the display panel 110 while moving the 90 degrees-rotated sealing unit 710 from one side of the second long side of the display panel 110 to the other side thereof, according to driving of the second gantry 724 of the moving unit 720. At this point, the sealing unit 710 coats a sealant on the edge portion corresponding to the second long side of the display panel 110 during the constant speed period of the moving unit 720 by using the coating member 712, and cures the coated sealant with the curing member 713 to form the sealing member 250 at the edge portion corresponding to the second long side of the display panel 110.

Figure 15E:
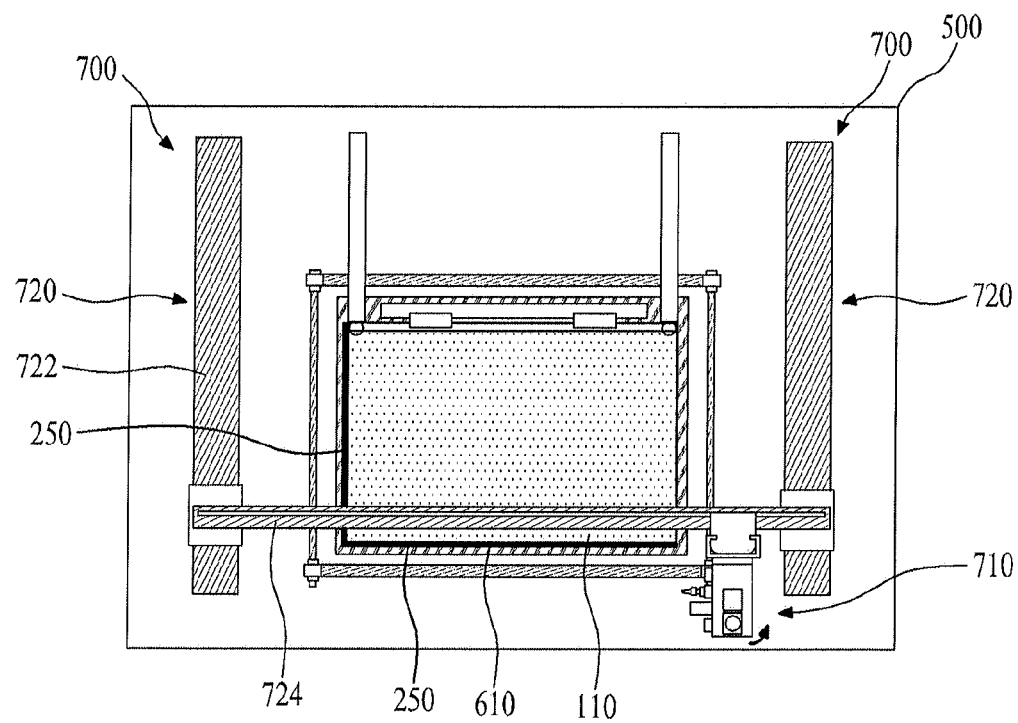

Then, as illustrated in FIG. 15E, the display manufacturing apparatus counterclockwise rotates the sealing unit 710, disposed at the other side of a first long side of the display panel 110, by about 90 degrees.

Figure 15F:
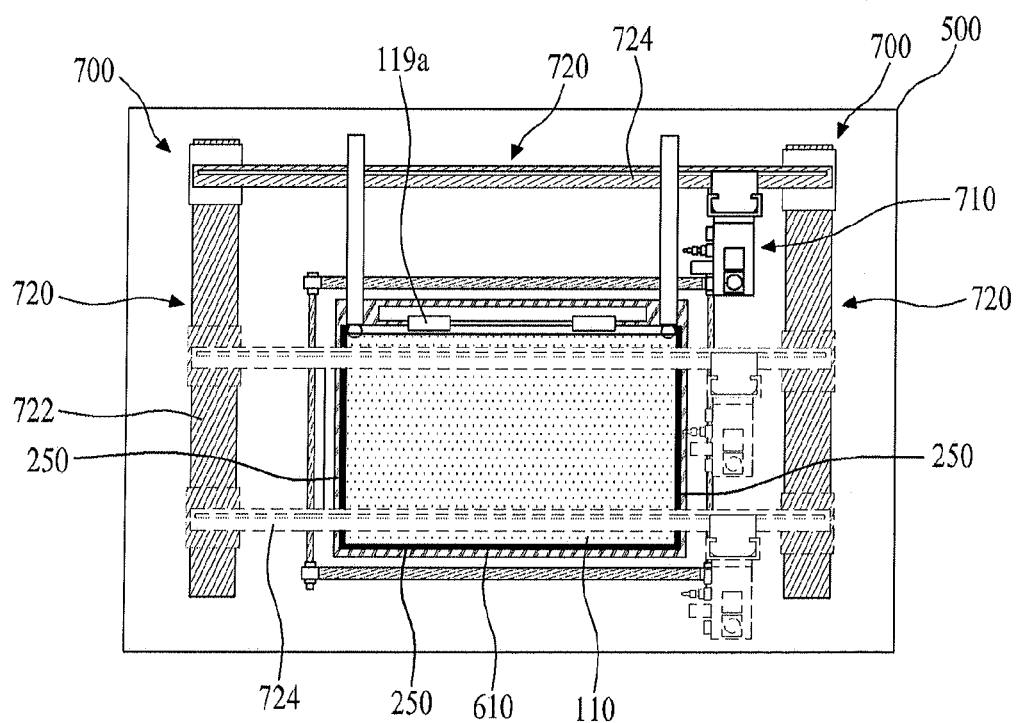

Subsequently, as illustrated in FIG. 15F, the display manufacturing apparatus forms the sealing member 250 at an edge portion corresponding to a second short side of the display panel 110 while moving the 90 degrees-rotated sealing unit 710 from one side of the second short side of the display panel 110 to the other side thereof, according to driving of the first gantry 722 of the moving unit 720. At this point, the sealing unit 710 coats a sealant on the edge portion corresponding to the second short side of the display panel 110 during the constant speed period of the moving unit 720 by using the coating member 712, and cures the coated sealant with the curing member 713 to form the sealing member 250 at the edge portion corresponding to the second short side of the display panel 110. Therefore, the sealing member 250 of FIG. 5, 6 or 7 is formed at an edge part of the display panel 110 corresponding to the first and second short sides and second long side other than the first long side of the display panel 110 to which the circuit films 119a are adhered.

Afterward, the display manufacturing apparatus counterclockwise rotates the sealing unit 710, disposed at the other side of the second short side of the display panel 110, by about 180 degrees and, as illustrated in FIG. 15A, the display manufacturing apparatus moves the sealing unit 710 to the home position thereof according to driving of the second gantry 724 without forming the sealing member 250. At this point, the sealing unit 710 may rotate while moving from the other side of the second short side of the display panel 110 to the home position thereof.

Thereafter, the display manufacturing apparatus unloads the display panel 110, having the edge portion with the sealing member 250 formed therein, from the stage 610 to the outside and then disposes another display panel 110 at the stage 610 and repeatedly performs respective operations of FIGS. 15A to 15F.

The display manufacturing apparatus according to the first embodiment forms the sealing member 250 at the edge part of the display panel 110 and thus can prevent the damage of the display panel 110 exposed to the outside, the partial detachment of the upper film, the penetration of moisture or the like, and side light leakage.

In the display manufacturing apparatus and method according to the first embodiment, it has been described above that the sealing unit 710 forms the sealing member 250 at the edge part of the display panel 110 while moving in the order of the first short side, second long side, second short side, and home position of the display panel 110 by driving of the moving unit 720. However, the sealing unit 710 may move only in the Y-axis direction along the first short side of the display panel 110 according to driving of the moving unit 720, and form the sealing member 250 at an edge portion corresponding to the other second long side and second short side of the display panel 110 according to rotation of the stage 610.

Figure 16:
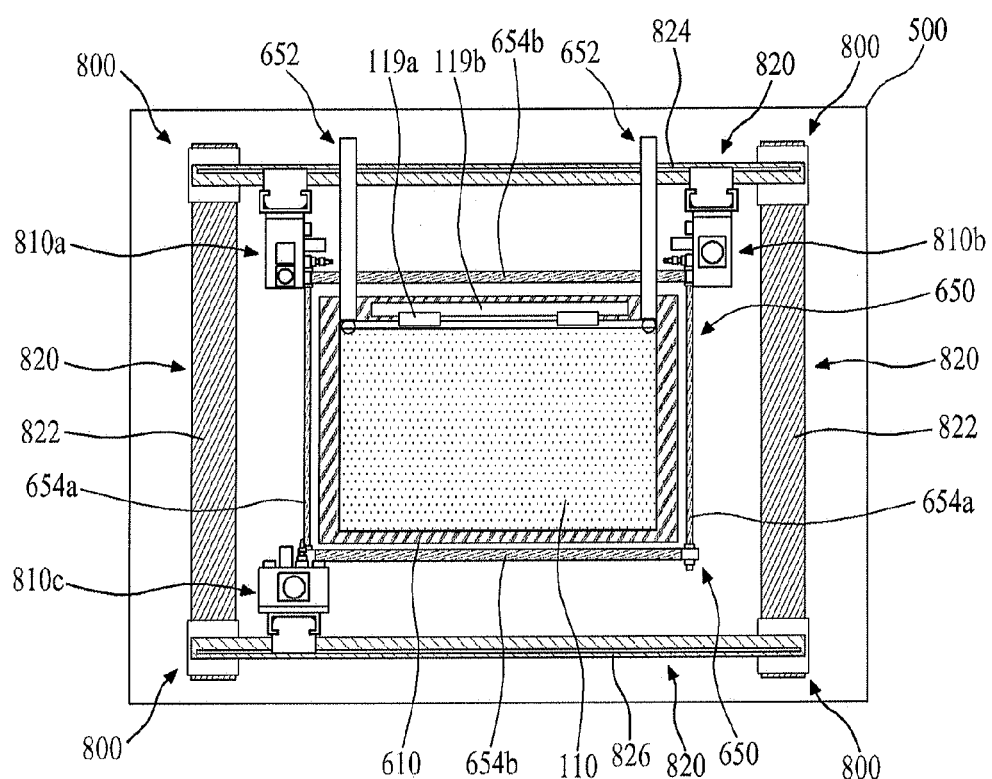
FIG. 16 is a plan view for describing a display manufacturing apparatus according to a second embodiment of the present invention for forming the sealing member of the display device according to the second embodiment of the present invention.

FIG. 16 is a plan view for describing a display manufacturing apparatus according to a second embodiment of the present invention for forming the sealing member of the display device according to the second embodiment of the present invention.

Referring to FIGS. 4 and 16, a display manufacturing apparatus according to the second embodiment of the present invention includes a panel supporting part 600 that is provided at a base frame 500 and supports a display panel 110, and a sealing member forming part 800 that forms the sealing member 250 at an edge part of the display panel 110 supported by the panel supporting part 600. Except for the sealing member forming part 800, the display manufacturing apparatus of the second embodiment having such a configuration has the same configuration as that of the display manufacturing apparatus of the first embodiment, and thus, the above description of the first embodiment is applied to the second embodiment. Like reference numerals refer to like elements throughout.

The sealing member forming part 800 coats a sealant on an edge part of the display panel 110 supported by a stage 610, and then forms the sealing member 250 at the edge part of the display panel 110 by curing the sealant. For this end, the sealing member forming part 800 includes first to third sealing units 810a to 810c that form the sealing member 250 at the edge part of the display panel 110, and a moving unit 820 that moves the first to third sealing units 810a to 810c.

Figure 17:
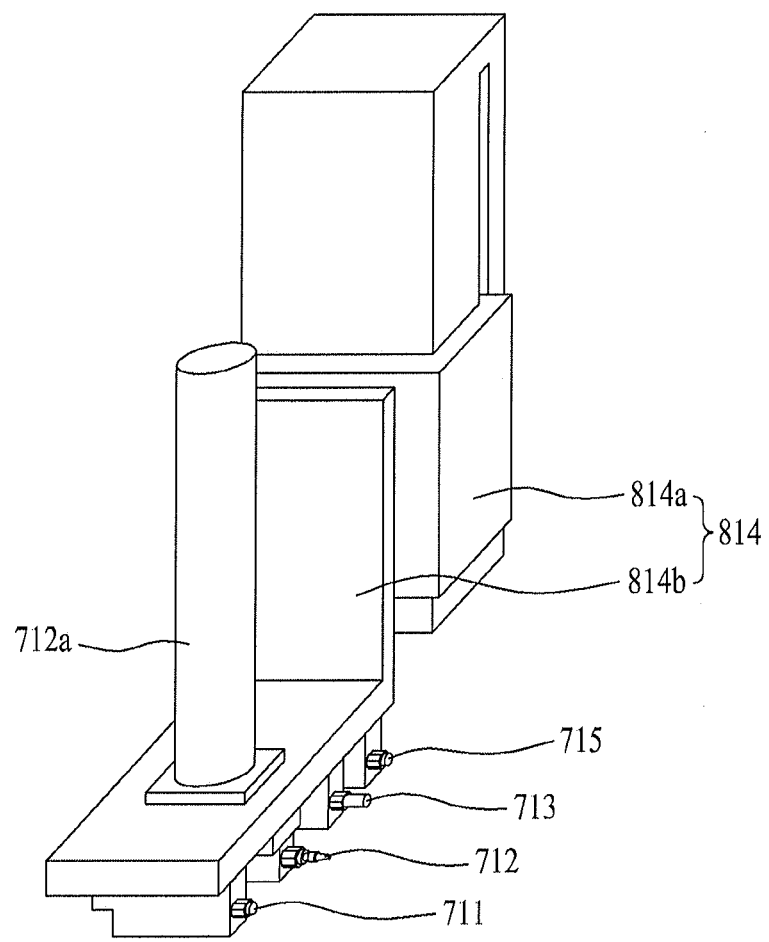
FIG. 17 is a view for describing a sealing unit of FIG. 16.

Each of the first to third sealing units 810a to 810c, as illustrated in FIG. 17, includes a detecting member 711, a coating member 712, a curing member 713, a supporting module 814, and a capturing member 715. Except for the supporting module 814, each of the first to third sealing units 810a to 810c having such a configuration has the same configuration as that of the sealing unit 710 of the display manufacturing apparatus of the first embodiment, and thus, the above description of the first embodiment is applied to the second embodiment. Like reference numerals refer to like elements throughout.

The supporting module 814 supports the detecting member 711, coating member 712, curing member 713, and capturing member 715 and simultaneously moves the detecting member 711, coating member 712, curing member 713, and capturing member 715 according to driving of the moving unit 820. For this end, the supporting module 814 includes a lifting member 814a, and a supporting bracket 814b.

The lifting member 814a is ascendably disposed at the moving unit 720 and ascendably supports the supporting bracket 814b. For this end, the lifting member 814a may lift the supporting bracket 814b in a cylinder scheme using a hydraulic cylinder or a pneumatic cylinder, a ball screw scheme using a motor and a ball screw, a gear scheme using a motor, rack gear, and pinion gear, a belt scheme using a motor, pulley, and belt, or a linear motor scheme. For example, when the coating member 712 forms the sealing member 250 of the first or second embodiment at the edge part of the display panel 110, the lifting member 714a may lift the supporting bracket 814b such that a discharge opening of a spray nozzle is disposed at a side center portion of the display panel 110 or between the side center portion and top of the display panel 110.

The supporting bracket 814b is disposed at the lifting member 814a and supports the detecting member 711, coating member 712, curing member 713, and capturing member 715. That is, the detecting member 711, coating member 712, curing member 713, and capturing member 715 are disposed under and fixed to the supporting bracket 814b. Herein, a syringe 712a that supplies a sealant to the coating member 712 is disposed on the supporting bracket 814b.

Referring again to FIG. 16, the moving unit 820 moves the first and second sealing units 810a and 810b in a Y-axis direction and moves the third sealing unit 810c in an X-axis direction, and thus allows the first to third sealing units 810a to 810c to form the sealing member 250 at an edge part of the display panel 110. The moving unit 820, as illustrated in FIG. 13, separately moves each of the first to third sealing units 810a to 810c according to the speed accelerating period P1, constant speed period P2, and speed reducing period P3. For this end, the moving unit 820 includes first to third gantries 822, 824 and 826.

The first gantry 822 is disposed in parallel to the base member 500 with the display panel 110 therebetween, and moves the second gantry 824 in the Y-axis direction. The first gantry 822 may use a ball screw scheme using a motor and a ball screw, a gear scheme using a motor, rack gear, and pinion gear, or a linear motor scheme. For example, the first gantry 822 uses the linear motor scheme.

The second gantry 824 is movably disposed at the first gantry 822 and movably supports the first and second sealing units 810a and 810b. Herein, the first sealing unit 810a is disposed at one side of the second gantry 824 in correspondence with a first short side of the display panel 110. The second sealing unit 810b is disposed at the other side of the second gantry 824 in correspondence with a second short side of the display panel 110. The second gantry 824 simultaneously moves the first and second sealing units 810a and 810b in the Y-axis direction so as to correspond to a short side of the display panel 110, according to driving of the first gantry 822.

The third gantry 826 is fixedly disposed at the first gantry 822, supports the third sealing unit 810c movably, and moves the third sealing unit 810c in the X-axis direction. The third gantry 826 moves the third sealing unit 810c in the X-axis direction so as to correspond to a second long side of the display panel 110. At this point, the third gantry 826 moves the third sealing unit 810c in the X-direction through the same driving scheme as that of the first gantry 822.

Figure 18A:
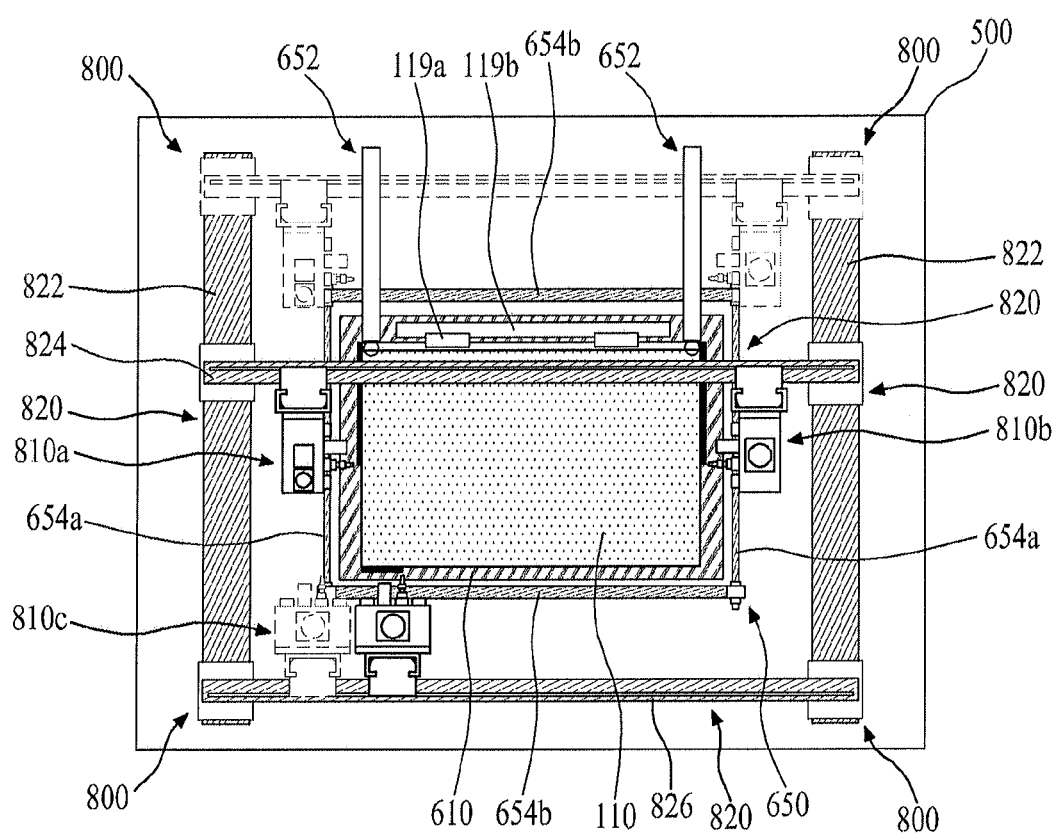
FIGS. 18A to 18C are views for sequentially describing a method which forms the sealing member of the display device according to the second embodiment of the present invention by using the display manufacturing apparatus according to the second embodiment of the present invention.
Figure 18B:
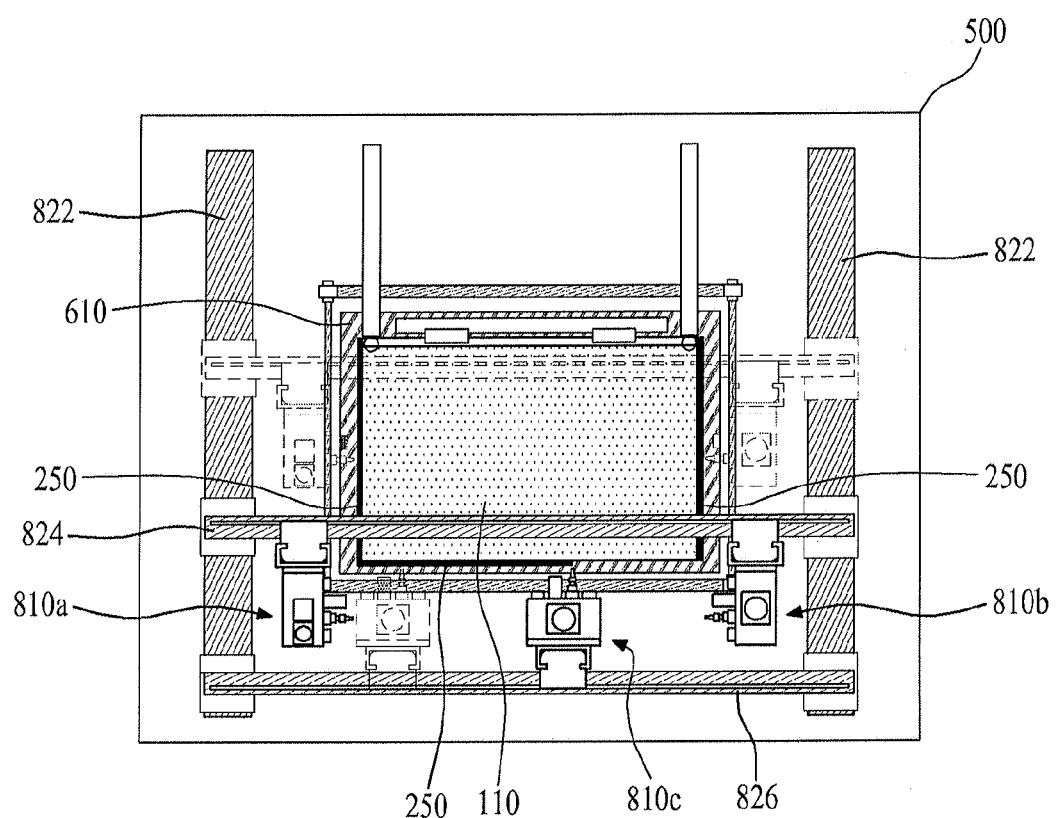
Figure 18C:
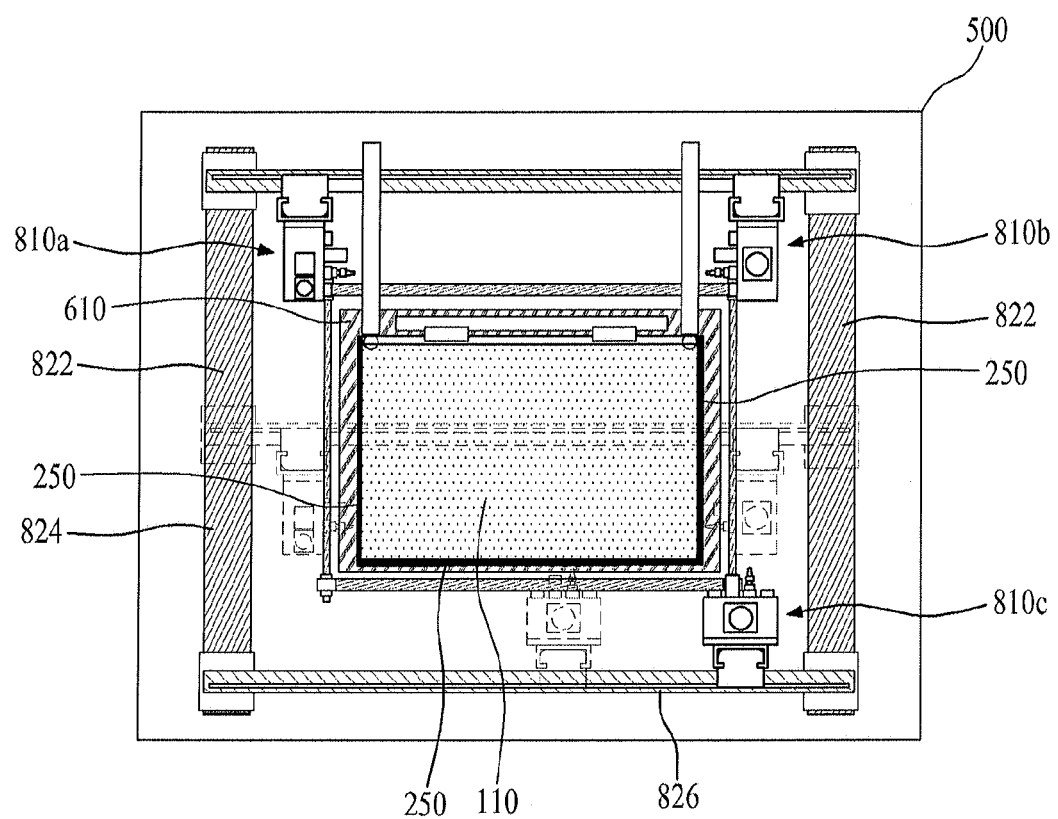

FIGS. 18A to 18C are views for sequentially describing a method which forms the sealing member of the display device according to the second embodiment of the present invention by using the display manufacturing apparatus according to the second embodiment of the present invention.

The method, which forms the sealing member of the display device according to the second embodiment of the present invention by using the display manufacturing apparatus according to the second embodiment of the present invention, will be sequentially described below with reference to FIGS. 4 and 18A to 18F.

First, as illustrated in FIG. 18A, the display panel 110 is disposed at the stage 610 of the panel supporting part 600, and thereafter the position of the display panel 110 disposed at the stage 610 is aligned according to driving of the panel aligning part 650.

Subsequently, the display manufacturing apparatus forms the sealing member 250 at an edge portion corresponding to first and second short sides of the display panel 110 while moving the first and second sealing units 810a and 810b from a home position thereof to the other side of a short side of the display panel 110, according to the Y-axis moving of the second gantry 824 by driving of the first gantry 822. At this point, each of the first and second sealing units 810a and 810b coats a sealant on the edge portion corresponding to the short side of the display panel 110 during a constant speed period of the moving unit 820 by using the coating member 712, and cures the coated sealant with the curing member 713 to form the sealing member 250 at the edge portion corresponding to the first and second short sides of the display panel 110.

Thereafter, when the first and second sealing units 810a and 810b move to a portion after a center portion of the short side of the display panel 110, in order to prevent the first and second sealing units 810a and 810b from colliding against the third sealing unit 810c, as illustrated in FIGS. 18A and 18B, the display manufacturing apparatus forms the sealing member 250 at an edge portion corresponding to a second long side of the display panel 110 while moving the third sealing unit 810a from a home position thereof to the other side of the second long side of the display panel 110, according to driving of the third gantry 826. At this point, the third sealing unit 810c coats a sealant on the edge portion corresponding to the second long side of the display panel 110 during the constant speed period of the moving unit 820 by using the coating member 712, and cures the coated sealant with the curing member 713 to form the sealing member 250 at the edge portion corresponding to the second long side of the display panel 110.

Then, when the display manufacturing apparatus completes a process where each of the first and second sealing units 810a and 810b forms the sealing member 250 at respective edge portions corresponding to the first and second short sides of the display panel 110, in order to prevent the first and second sealing units 810a and 810b from colliding against the third sealing unit 810c, as illustrated in FIG. 18C, each of the first and second sealing units 810a and 810b returns to the home position thereof while the third sealing unit 810c forms the sealing member 250 at an edge portion corresponding to the second long side of the display panel 110.

Subsequently, when the display manufacturing apparatus completes a process where the third sealing unit 810c forms the sealing member 250 at the edge portion corresponding to the second long side of the display panel 110, the display manufacturing apparatus returns to the home position of the third sealing unit 810c.

Thereafter, the display manufacturing apparatus unloads the display panel 110, having the edge portion with the sealing member 250 formed therein, from the stage 610 to the outside and then disposes another display panel 110 at the stage 610 and repeatedly performs respective operations of FIGS. 18A to 18C.

The display manufacturing apparatus according to the second embodiment forms the sealing member 250 at the edge part of the display panel 110 and thus can prevent the damage of the display panel 110 exposed to the outside, the partial detachment of the upper polarizing film 116, the penetration of moisture or the like, and side light leakage. In the display manufacturing apparatus according to the second embodiment, the number of sealing units further increases by three times than the display manufacturing apparatus according to the first embodiment, but a time taken in forming the sealing member 250 decreases by one-third compared to the display manufacturing apparatus according to the first embodiment. Accordingly, the display manufacturing apparatus according to the second embodiment can enhance productivity.

Figure 19:
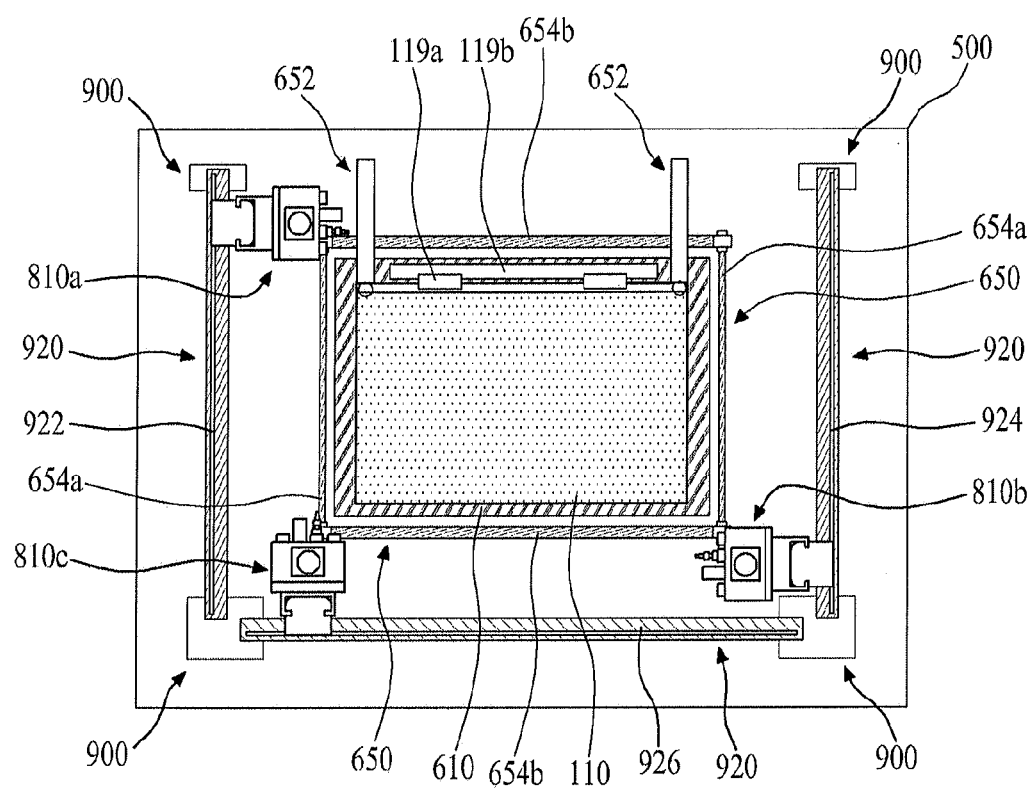
FIG. 19 is a plan view for describing the display manufacturing apparatus according to the second embodiment of the present invention for forming the sealing member of the display device according to the third embodiment of the present invention.

FIG. 19 is a plan view for describing the display manufacturing apparatus according to the second embodiment of the present invention for forming the sealing member of the display device according to the third embodiment of the present invention.

Referring to FIGS. 4 and 19, a display manufacturing apparatus according to the third embodiment of the present invention includes a panel supporting part 600 that is provided at a base frame 500 and supports a display panel 110, and a sealing member forming part 900 that forms the sealing member 250 at an edge part of the display panel 110 supported by the panel supporting part 600. Except for the sealing member forming part 900, the display manufacturing apparatus of the third embodiment having such a configuration has the same configuration as that of the display manufacturing apparatus of the first embodiment, and thus, the above description of the first embodiment is applied to the second embodiment. Like reference numerals refer to like elements throughout.

The sealing member forming part 900 coats a sealant on an edge part of the display panel 110 supported by a stage 610, and then forms the sealing member 250 at the edge part of the display panel 110 by curing the sealant. For this end, the sealing member forming part 900 includes first to third sealing units 810a to 810c that form the sealing member 250 at the edge part of the display panel 110, and a moving unit 920 that moves the first to third sealing units 810a to 810c. Except for the moving unit 920, the sealing member forming part 900 having such a configuration has the same configuration as that of the sealing member forming part 800 in the display manufacturing apparatus of the second embodiment, and thus, the above description of the second embodiment is applied to the first to third sealing units 810a to 810c. The moving unit 920 will be described below.

The moving unit 820, as illustrated in FIG. 13, separately moves each of the first to third sealing units 810a to 810c according to the speed accelerating period P1, constant speed period P2, and speed reducing period P3. For this end, the moving unit 920 includes first to third gantries 922, 924 and 926.

The first gantry 922 is disposed at the base member 500 to be adjacent to one short side of the stage 610, namely, a first short side of the display panel 110, and moves the first sealing unit 810a in a Y-axis direction. The first gantry 922 may use a ball screw scheme using a motor and a ball screw, a gear scheme using a motor, rack gear, and pinion gear, or a linear motor scheme. For example, the first gantry 822 uses the linear motor scheme.

The second gantry 924 is disposed at the base member 500 to be adjacent to the other short side of the stage 610, namely, a second short side of the display panel 110, and moves the second sealing unit 810b in the Y-axis direction. The second gantry 924 moves the second sealing unit 810b in the Y-axis direction through the same driving scheme as that of the first gantry 922.

The third gantry 926 is disposed at the base member 500 to be adjacent to one long side of the stage 610, namely, a second long side of the display panel 110, and moves the third sealing unit 810c in an X-axis direction. The third gantry 926 moves the third sealing unit 810c in the X-axis direction through the same driving scheme as that of the first and second gantries 922 and 924.

Figure 20A:
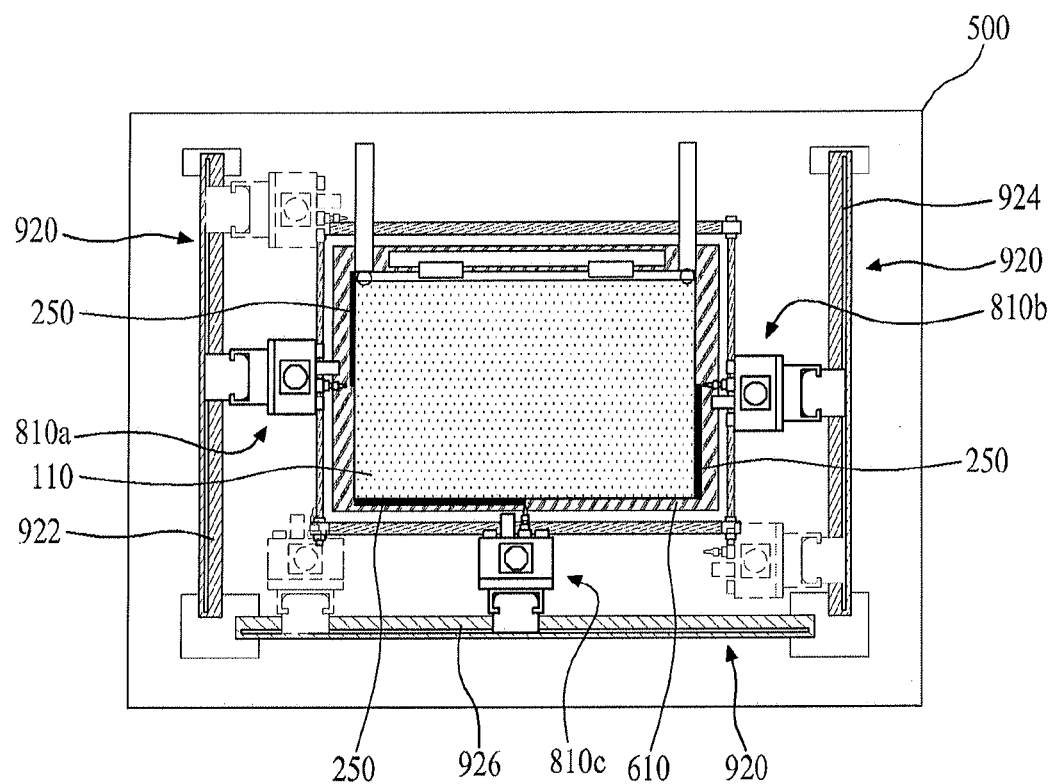
FIGS. 20A and 20B are views for sequentially describing a method which forms the sealing member of the display device according to the second embodiment of the present invention by using the display manufacturing apparatus according to the third embodiment of the present invention.
Figure 20B:
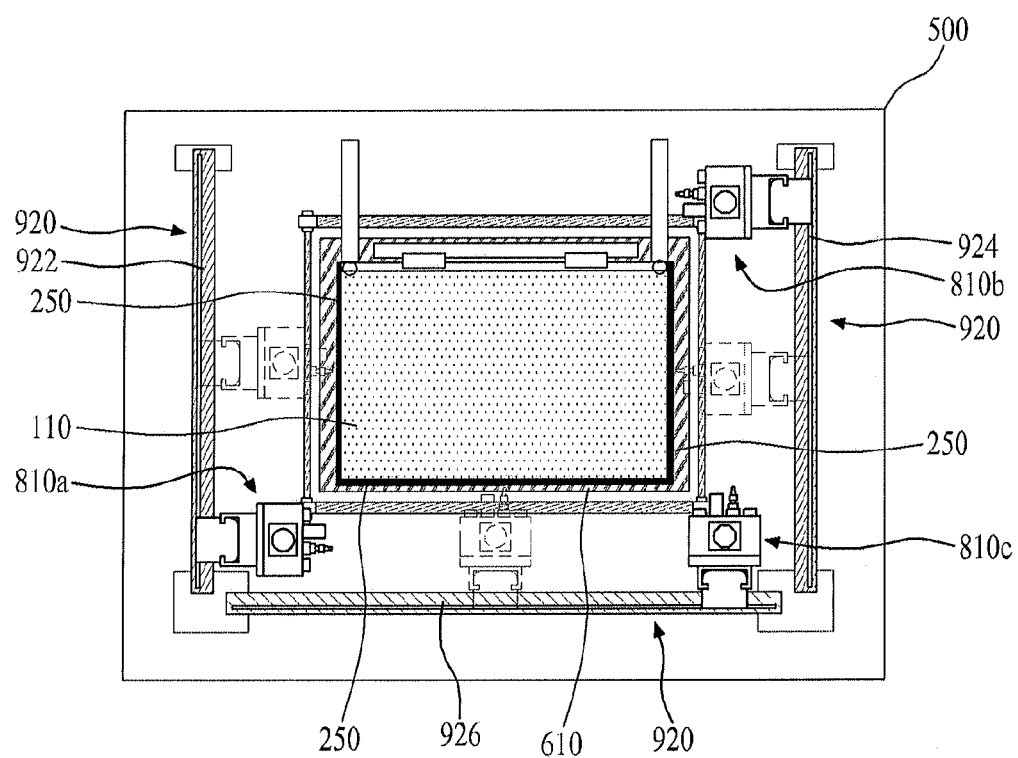

FIGS. 20A and 20B are views for sequentially describing a method which forms the sealing member of the display device according to the second embodiment of the present invention by using the display manufacturing apparatus according to the third embodiment of the present invention.

The method, which forms the sealing member of the display device according to the second embodiment of the present invention by using the display manufacturing apparatus according to the third embodiment of the present invention, will be sequentially described below with reference to FIGS. 4, 19, 20A and 20B.

First, as illustrated in FIG. 19, the display panel 110 is disposed at the stage 610 of the panel supporting part 600, and thereafter the position of the display panel 110 disposed at the stage 610 is aligned according to driving of the panel aligning part 650.

Subsequently, as illustrated in FIG. 20A, the display manufacturing apparatus simultaneously drives the first to third gantries 922, 924 and 926 to move each of the first and second sealing units 810a and 810b from a home position thereof to the Y-axis direction, thereby forming the sealing member 250 at an edge portion corresponding to each of first and second short sides of the display panel 110. Simultaneously, the display manufacturing apparatus forms the sealing member 250 at an edge portion corresponding to a second long side of the display panel 110 while moving the third sealing unit 810c from a home position thereof to an X-axis direction. At this point, each of the first to third sealing units 810a to 810c coats a sealant on an edge portion corresponding to each of the first and second short sides and second long side of the display panel 110 during a constant speed period of the moving unit 920 by using the coating member 712, and cures the coated sealant with the curing member 713 to form the sealing member 250 at the edge portion corresponding to each of the first and second short sides and second long side of the display panel 110.

Then, as illustrated in FIG. 20B, when the display manufacturing apparatus completes a process where each of the first to third sealing units 810a to 810c forms the sealing member 250 at respective edge portions corresponding to the first and second short sides and second long side of the display panel 110, each of the first to third sealing units 810a to 810c returns to the home position thereof.

Subsequently, the display manufacturing apparatus unloads the display panel 110, having the edge portion with the sealing member 250 formed therein, from the stage 610 to the outside and then disposes another display panel 110 at the stage 610 and repeatedly performs respective operations of FIGS. 20A and 20B.

The display manufacturing apparatus according to the third embodiment forms the sealing member 250 at the edge part of the display panel 110 and thus can prevent the damage of the display panel 110 exposed to the outside, the partial detachment of the upper polarizing film 116, the penetration of moisture or the like, and side light leakage. In the display manufacturing apparatus according to the third embodiment, each of the first to third sealing units 810a to 810c moves separately unlike the display manufacturing apparatus according to the second embodiment, and thus, a time taken in forming the sealing member 250 is further saved, thereby enhancing productivity.

According to the embodiments of the present invention, by coupling the display panel to the panel supporting member with the panel coupling member, an upper case and a front set cover are removed from general display devices, and thus, the step height is removed from the border portion of the display panel, thereby minimizing a thickness and enhancing a sense of beauty in terms of design.

Moreover, by forming the sealing member at the edge part of the display panel, some of cases and set covers are removed from display devices, thus preventing the damage of the display panel, the partial detachment of the upper film, the penetration of moisture, and side light leakage.

Moreover, the sealing member is formed at the edge part of the display panel by the at least one sealing unit (which coats the sealant on the edge part of the display panel disposed at the panel supporting part, and cures the sealant) and the moving unit that moves the sealing unit, and thus, the sealing member can be easily formed.

Moreover, the capturing member can check in real time the shape of the sealing member that is formed at the edge part of the display panel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A display manufacturing apparatus comprising:
   a base frame;
   a panel supporting part disposed at the base frame, and supporting a display panel which comprises a lower substrate, an upper substrate facing-coupled to the lower substrate, and at least one upper film adhered to the upper substrate; and
   a sealing member forming part disposed at the base frame, and forming a sealing member at lateral sides of a display panel which is disposed at the panel supporting part,
   wherein the sealing member forming part comprises:
      a sealing unit configured to form the sealing member by curing a sealant while spraying the sealant by a spraying nozzle on the lateral side of the display panel, the sealing unit including a supporting bracket, a supporting frame rotatably mounted to the supporting bracket, a coating member for spraying the sealant on the lateral side of the display panel, and a curing member for curing the sealant coated on the lateral sides of the display panel to form the sealing member, wherein the coating member and the curing member are mounted on the supporting frame, extend laterally from the supporting frame toward the lateral sides of the display panel, and wherein the curing member cures the sealant after the coating member applies the sealant on the lateral sides of the display panel; and
      a moving unit that moves the sealing unit along the lateral sides of the display panel,
      wherein the supporting bracket is translatable along the lateral sides of the display panel without rotating and the supporting frame that supports the coating member and the curing member is rotatable to maintain an opening of the coating member and an opening of the curing member toward the lateral sides of the display panel when the moving unit moves the sealing unit along the lateral sides of the display panel.

2. The display manufacturing apparatus of claim 1, wherein the display panel further comprises:
   a plurality of circuit films adhered to one side of the lower substrate corresponding to a first long side of first and second long sides of the display panel; and
   a Printed Circuit Board (PCB) adhered to the circuit films,
   wherein the sealing member forming part is configured to form the sealing member at three lateral sides of the display panel corresponding to the second long side and first and second short sides of the display panel.

3. The display manufacturing apparatus of claim 1, wherein the sealing member forming part is configured to form the sealing member at the lateral side of the display panel including a side of each of the lower substrate, upper substrate, and upper film.

4. The display manufacturing apparatus of claim 1,
wherein the sealing member forming part is configured to form the sealing member at the lateral side of the display panel including an entire side of the upper film, an entire side of the upper substrate, and an entire side of the lower substrate,
wherein the sealing member forming part is configured to further to form the sealing member at a top edge portion of the upper film and a rear edge portion of the lower substrate.

5. The display manufacturing apparatus of claim 2, wherein,
the moving unit separately moves the sealing unit according to a speed accelerating period, a constant speed period, and a speed reducing period, and
the sealing unit forms the sealing member at the lateral side of the display panel only during the constant speed period.

6. The display manufacturing apparatus of claim 2, wherein the sealing unit further comprises:
a detecting member detecting the lateral side of the display panel to be coated with the sealing member; and
a supporting module supporting the detecting member, the coating member, and the curing member, and simultaneously moving the detecting member, the coating member, and the curing member according to driving of the moving unit,
wherein the detecting member extends laterally from the supporting frame toward the lateral side of the display panel in a first direction, and
wherein the detecting member, the coating member and the curing member are disposed along a second direction perpendicular to the first direction and along the lateral side of the display panel.

7. The display manufacturing apparatus of claim 6, wherein the curing member cures the coated sealant within about 5 sec from a time when the sealant is coated.

8. The display manufacturing apparatus of claim 6, wherein the sealing unit further comprises a capturing member disposed at the supporting module to be adjacent to the curing member, and capturing the sealing member which is cured and formed by the sealing member, the capturing member extending laterally from the supporting frame toward the lateral side of the display panel in a first direction,
wherein the capturing member, the detecting member, the coating member, and the curing member are disposed along a second direction perpendicular to the first direction and along the lateral side of the display panel.

9. The display manufacturing apparatus of claim 6, wherein the supporting module comprises:
a lifting member disposed at the moving unit ascendably;
a supporting bracket disposed at the lifting member;
a supporting frame supporting the detecting member, the coating member, and the curing member; and
a rotating member disposed at the supporting bracket to be coupled to the supporting frame, and rotating the supporting frame.

10. The display manufacturing apparatus of claim 2, wherein the sealing unit moves in the order of the first short side, second long side, second short side, and home position of the display panel from the home position, and forms the sealing member at the lateral side of the display panel corresponding to the first and second short sides and second long side of the display panel.

11. The display manufacturing apparatus of claim 2, wherein the sealing member forming part comprises:
first to third sealing units forming the sealing member at the lateral side of the display panel; and
a moving unit moving the first to third sealing units.

12. The display manufacturing apparatus of claim 11, wherein each of the first to third sealing units comprises:
a detecting member detecting the lateral side of the display panel to be coated with the sealing member;
a coating member coating the sealant on the detected lateral side of the display panel;
a curing member curing the sealant, coated on the lateral side of the display panel, to form the sealing member; and
a supporting module supporting the detecting member, coating member, and curing member, and simultaneously moving the detecting member, coating member, and curing member according to driving of the moving unit.

13. The display manufacturing apparatus of claim 12, wherein the supporting module comprises:
a lifting member disposed at the moving unit ascendably; and
a supporting bracket disposed at the lifting member, and supporting the detecting member, coating member, and curing member.

14. The display manufacturing apparatus of claim 11, wherein,
the moving unit separately moves the sealing unit according to a speed accelerating period, a constant speed period, and a speed reducing period, and
the sealing unit forms the sealing member at the lateral side of the display panel only during the constant speed period.

15. The display manufacturing apparatus of claim 11, wherein the moving unit comprises:
a first gantry disposed in parallel to the base frame with the display panel therebetween;
a second gantry disposed at one side of the first gantry movably, and supporting the first and second sealing units to be separated from each other with the display panel therebetween; and
a third gantry disposed, at the other side of the first gantry, and supporting and moving the third sealing unit.

16. The display manufacturing apparatus of claim 15, wherein,
the first sealing unit moves according to moving of the second gantry, and forms the sealing member at a first lateral side of the display panel corresponding to the first short side of the display panel,
the second sealing unit moves according to moving of the second gantry, and forms the sealing member at a second lateral side of the display panel corresponding to the second short side of the display panel, and
the third sealing unit moves according to moving of the third gantry, and forms the sealing member at a third lateral side of the display panel corresponding to the second long side of the display panel.

17. The display manufacturing apparatus of claim 11, wherein the moving unit comprises:
a first gantry disposed at the base frame in correspondence with the first short side of the display panel, and supporting and moving the first sealing unit;

a second gantry disposed at the base frame in correspondence with the second short side of the display panel, and supporting and moving the second sealing unit; and a third gantry disposed at the base frame in correspondence with the second long side of the display panel, and supporting and moving the third sealing unit.

18. The display manufacturing apparatus of claim 17, wherein, the first sealing unit moves by the first gantry, and forms the sealing member at a first lateral side of the display panel corresponding to the first short side of the display panel, the second sealing unit moves by the second gantry, and forms the sealing member at a second lateral side of the display panel corresponding to the second short side of the display panel, and the third sealing unit moves by the third gantry, and forms the sealing member at a third lateral side of the display panel corresponding to the second long side of the display panel.

19. The display manufacturing apparatus of claim 1, wherein the sealing member is not formed on a top edge portion of the display panel.

20. The display manufacturing apparatus of claim 1, wherein the supporting frame rotates 90 degrees each time and rotates only when the supporting bracket is transitioned from a first edge of the display panel to a second edge of the display panel vertical to the first edge.

21. A display manufacturing apparatus comprising:
a base frame;
a panel supporting part disposed at the base frame providing support for a display panel comprising a lower substrate and an upper substrate facing the lower substrate to form a display panel an edge surface around a periphery of the display panel the edge surface oriented orthogonal to the upper and the lower substrate at the periphery thereof; and a sealing unit disposed at a lateral side of the display panel, the sealing unit comprising a spraying nozzle, a curing member, and a sensing member, the sealing unit traversing a length of the edge of the display panel when in operation, wherein the spraying nozzle directs a sealant to at least the edge surface, the curing member applies a curing energy to the sealant sprayed on at least the edge surface and the sensing member maintains a constant distance between the spraying nozzle and the edge surface.

22. The apparatus of claim 21, wherein the sealant has a viscosity between about 1500 centipoise (cps) to about 30,000 cps.

23. The apparatus of claim 21, wherein the sealing unit is rotatable to position the spraying nozzle to face each edge being sealed.

24. The apparatus of claim 21, wherein the sealant is applied to the edge surface and to a peripheral strip on an exposed surface of the upper substrate and the lower substrate.

* * * * *